(12) United States Patent
Wu

(10) Patent No.: US 8,579,620 B2
(45) Date of Patent: Nov. 12, 2013

(54) SINGLE-ACTION THREE-DIMENSIONAL MODEL PRINTING METHODS

(76) Inventor: Andy Wu, Lexington, MA (US)

(*) Notice: Subject to any disclaimer, the term of this patent is extended or adjusted under 35 U.S.C. 154(b) by 89 days.

(21) Appl. No.: 13/039,048

(22) Filed: Mar. 2, 2011

(65) Prior Publication Data

US 2012/0224755 A1    Sep. 6, 2012

(51) Int. Cl.
*B22D 11/01* (2006.01)
*B22F 9/00* (2006.01)
*B28B 1/54* (2006.01)
*B28B 17/00* (2006.01)
*B29B 9/00* (2006.01)
*B29C 67/02* (2006.01)

(52) U.S. Cl.
USPC ............ 425/7; 425/97; 425/100; 425/110; 358/3.11; 703/1; 703/2

(58) Field of Classification Search
USPC .......... 700/98, 118–119, 163; 33/617, 627; 101/3.1, 35, 93.01, 93.04, 93.05; 358/1.14, 3.11; 264/572; 425/7, 100, 425/110, 97; 703/1–2
See application file for complete search history.

(56) References Cited

U.S. PATENT DOCUMENTS

| | | | | |
|---|---|---|---|---|
| 5,636,334 A * | 6/1997 | Hidaka | | 345/419 |
| 6,117,061 A * | 9/2000 | Popat et al. | | 493/325 |
| 6,600,965 B1 * | 7/2003 | Hull et al. | | 700/120 |
| 7,006,952 B1 * | 2/2006 | Matsumoto et al. | | 703/2 |
| 7,983,792 B2 * | 7/2011 | Gombert et al. | | 700/233 |
| 7,995,812 B2 * | 8/2011 | Ohtsuka | | 382/128 |
| 8,249,732 B2 * | 8/2012 | Stephens et al. | | 700/98 |
| 2002/0028417 A1 * | 3/2002 | Chapoulaud et al. | | 433/24 |
| 2002/0059049 A1 * | 5/2002 | Bradbury et al. | | 703/11 |
| 2003/0074174 A1 * | 4/2003 | Fu et al. | | 703/13 |
| 2003/0107568 A1 * | 6/2003 | Urisaka et al. | | 345/419 |
| 2003/0167099 A1 * | 9/2003 | Kesavadas et al. | | 700/119 |
| 2005/0129281 A1 * | 6/2005 | Ashizaki et al. | | 382/112 |
| 2006/0075356 A1 * | 4/2006 | Faulkner et al. | | 715/782 |
| 2006/0192778 A1 * | 8/2006 | Otani | | 345/419 |
| 2006/0209064 A1 * | 9/2006 | Otani | | 345/419 |
| 2009/0149977 A1 * | 6/2009 | Schendel | | 700/98 |
| 2009/0248184 A1 * | 10/2009 | Steingart et al. | | 700/98 |
| 2009/0316965 A1 * | 12/2009 | Mailling et al. | | 382/128 |
| 2010/0149597 A1 * | 6/2010 | Gombert et al. | | 358/1.18 |
| 2012/0035888 A1 * | 2/2012 | Shin | | 703/1 |
| 2012/0105903 A1 * | 5/2012 | Pettis | | 358/1.14 |

OTHER PUBLICATIONS

Fujifilm 3D Print System, by Fujifilm Corporation, 2010 Fujifilm Corporation, pp. 1-2, Ref. No.-1025E (SK-10-09-F1079-F9711).*
JmolTraining Guide, Designing Models for 3D Printing, MOSE Center for Biomolecular Modeling, Copyright 2010, pp. 1-13.*
InVision HR 3D Printer can print jewelry parts in a day by Gizmag Team, Nov. 1, 2004, pp. 1-7.*

* cited by examiner

*Primary Examiner* — Ramesh Patel
(74) *Attorney, Agent, or Firm* — Coats and Bennett, P.L.L.C.

(57) ABSTRACT

Methods and techniques of using 3D printers to create physical models from image data are discussed. Geometric representations of different physical models are described and complex data conversion processes that convert input image data into geometric representations compatible with third party 3D printers are disclosed. Printing templates are used to encapsulate complex geometric representations and complicated data conversion processes from users for fast and simple 3D physical model printing applications.

9 Claims, 20 Drawing Sheets

The Invention

Fig. 1 Existing Methods

Fig 2. The Invention

Fig 3. Flowchart of the single-action 3D model printing methods

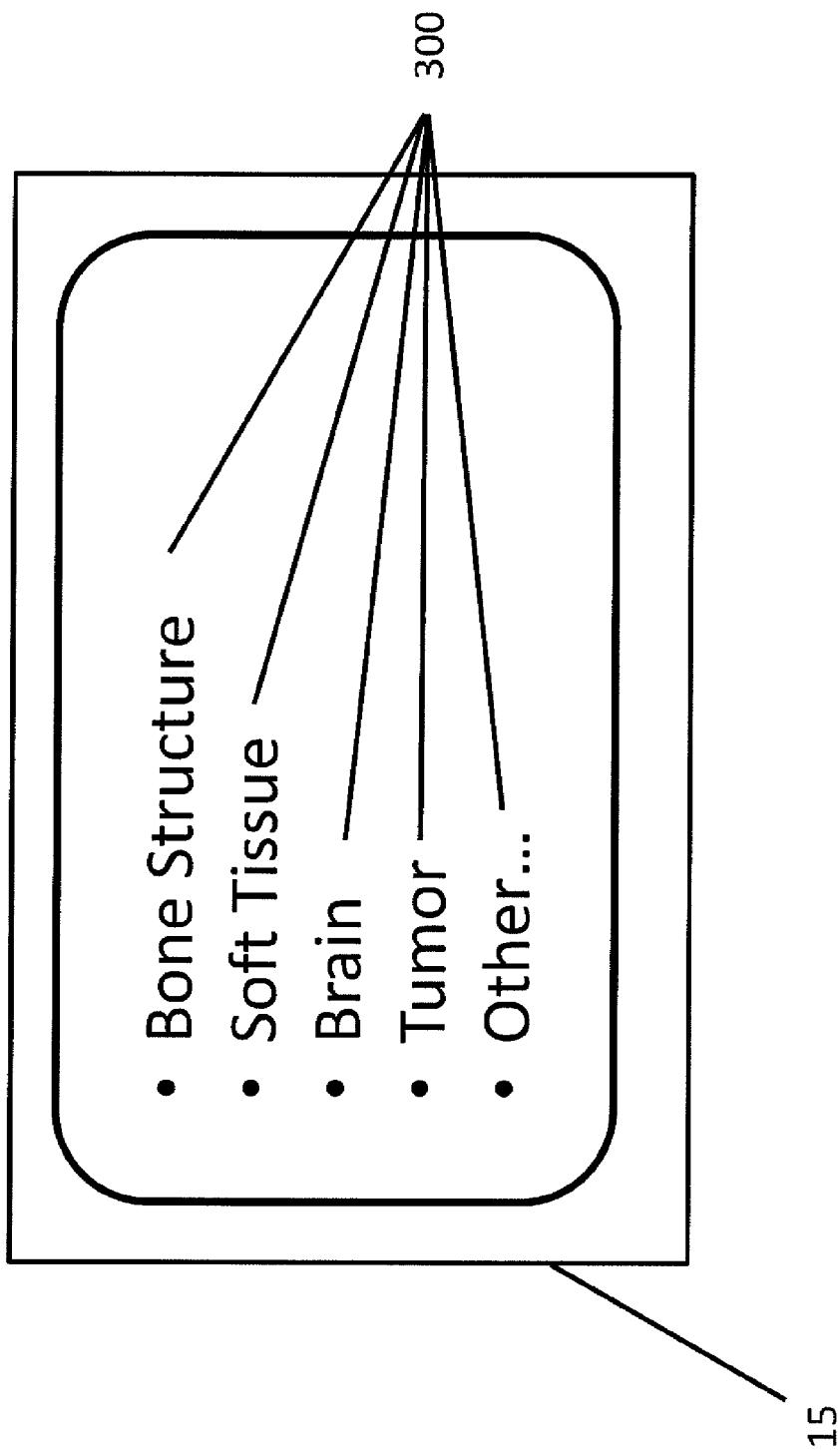
Fig 5. An Example of Printing Templates Described with Text

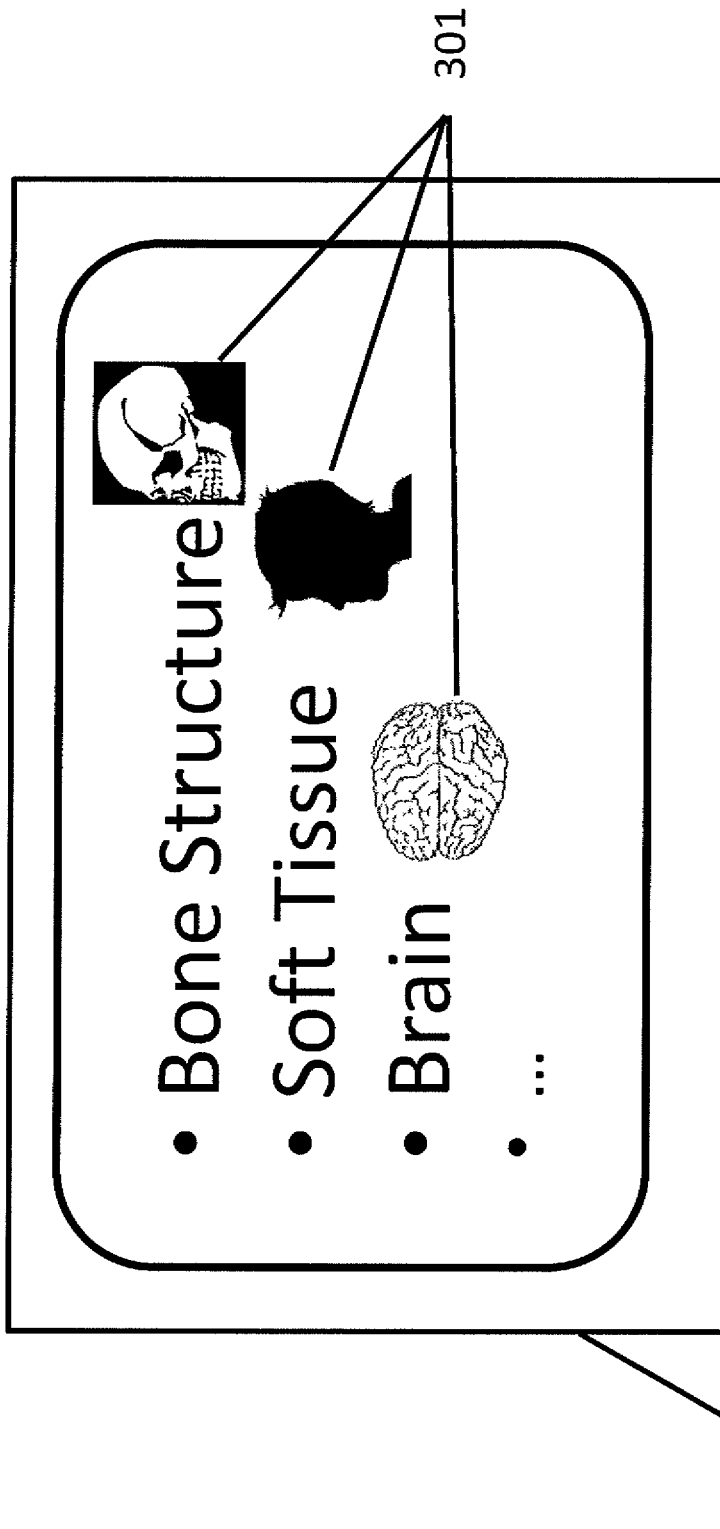
Fig 6. An Example of Printing Templates Described By Text and Graphics

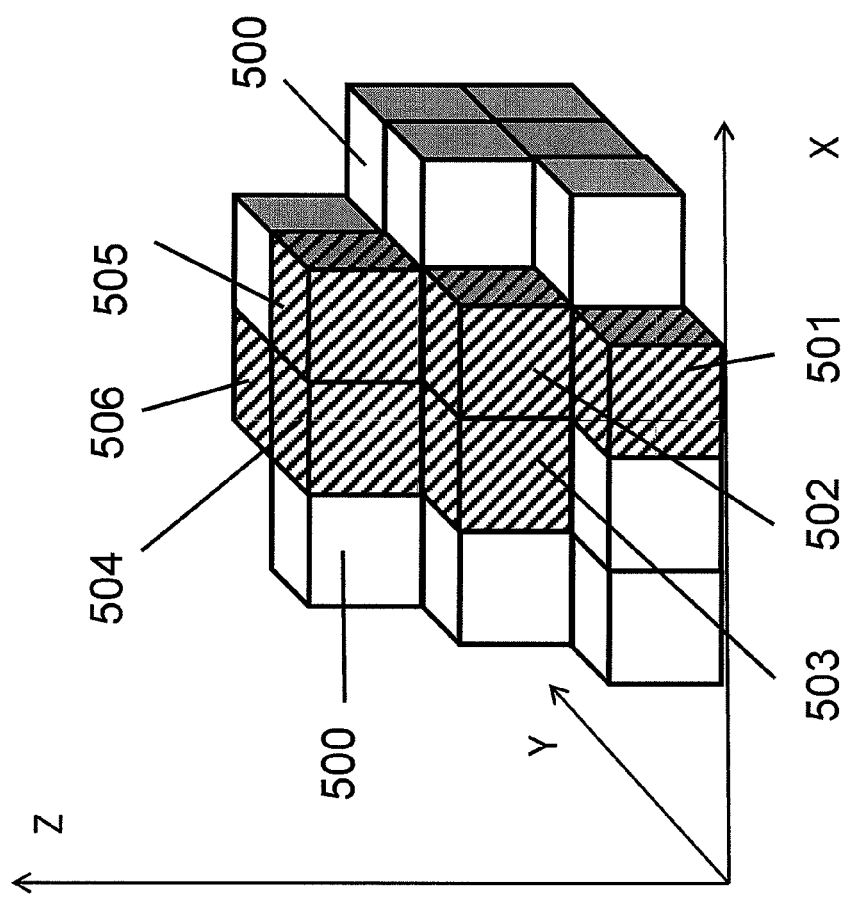
Fig 7. An Example of 3D Points

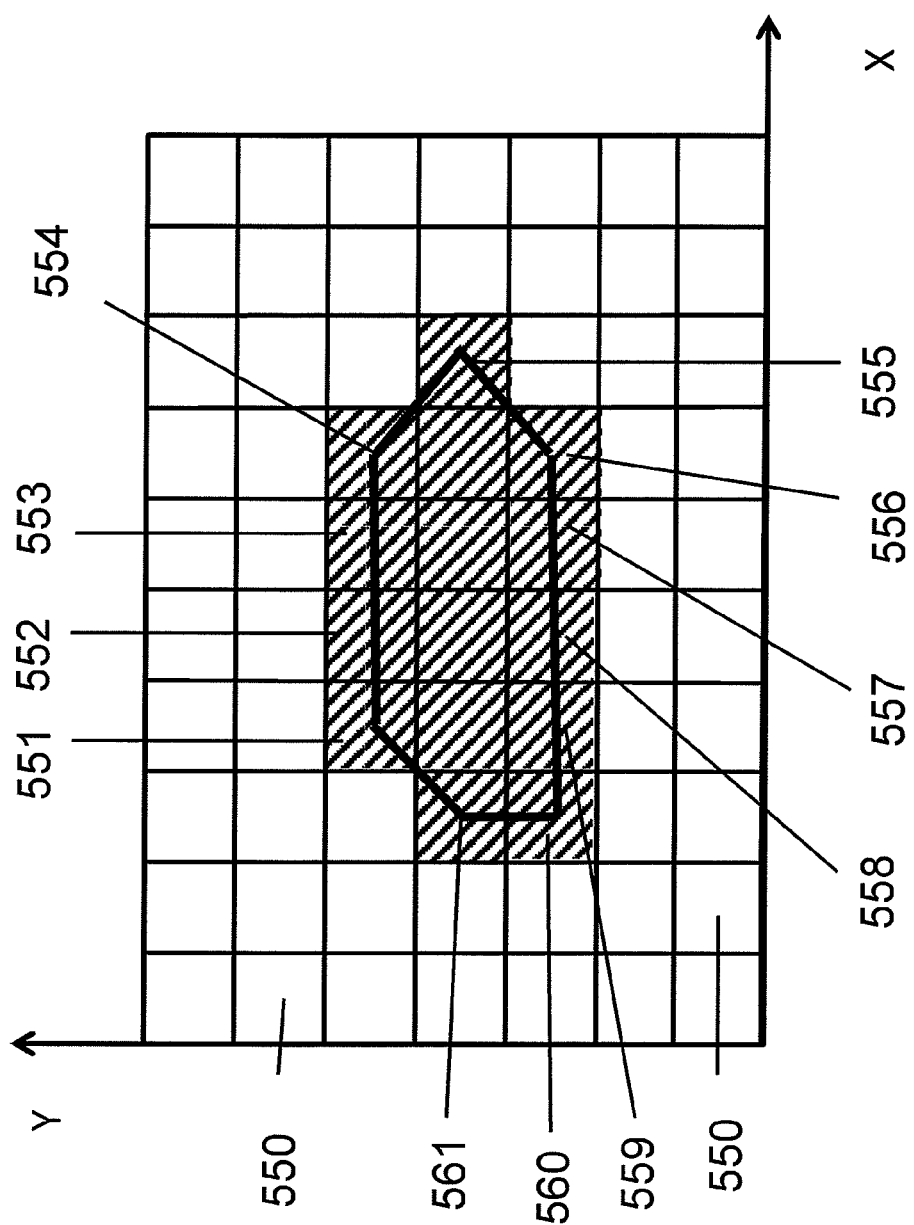
Fig 8. A Contour Example

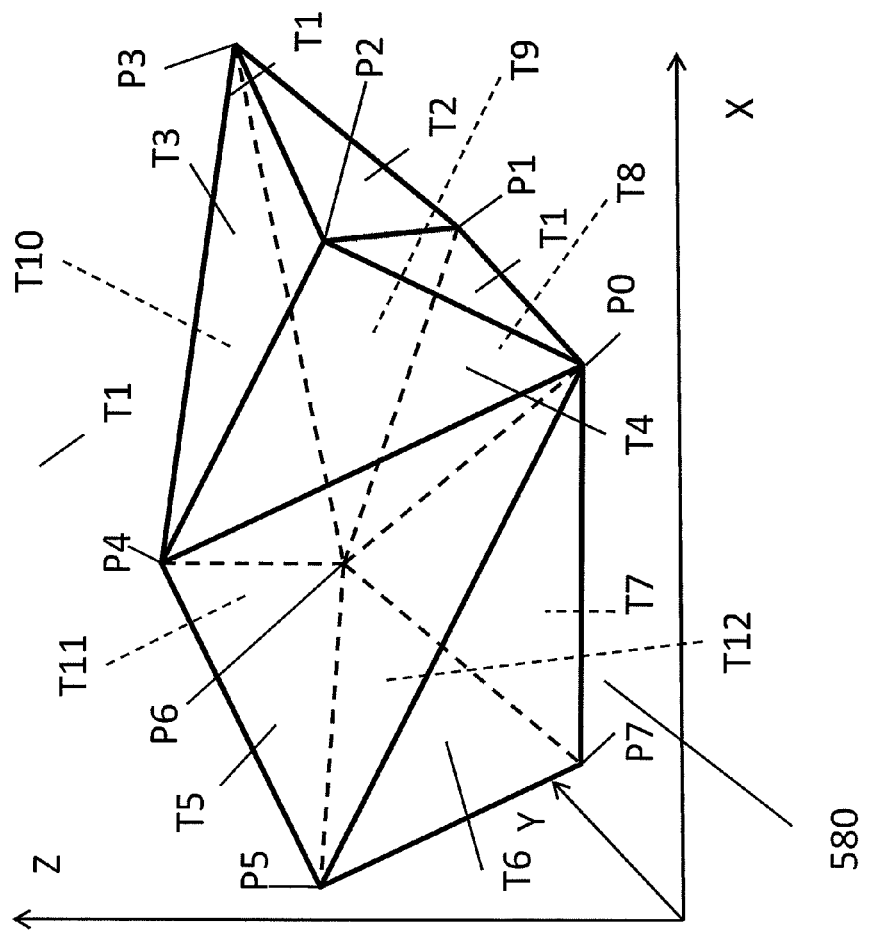
Fig 9. An Example of A Triangle-Based Surface Model

| Tissue | CT number (HU) |
|---|---|
| Bone | >1000 |
| Liver | 40 to 60 |
| White matter | ~20 to 30 |
| Grey matter | ~37 to 45 |
| Blood | 40 |
| Muscle | 10 to 40 |
| Kidney | 30 |
| Cerebrospinal fluid | 15 |
| Water | 0 |
| Fat | -50 to -100 |
| Air | -1000 |

Figure 10. Sample CT numbers for various human tissues.

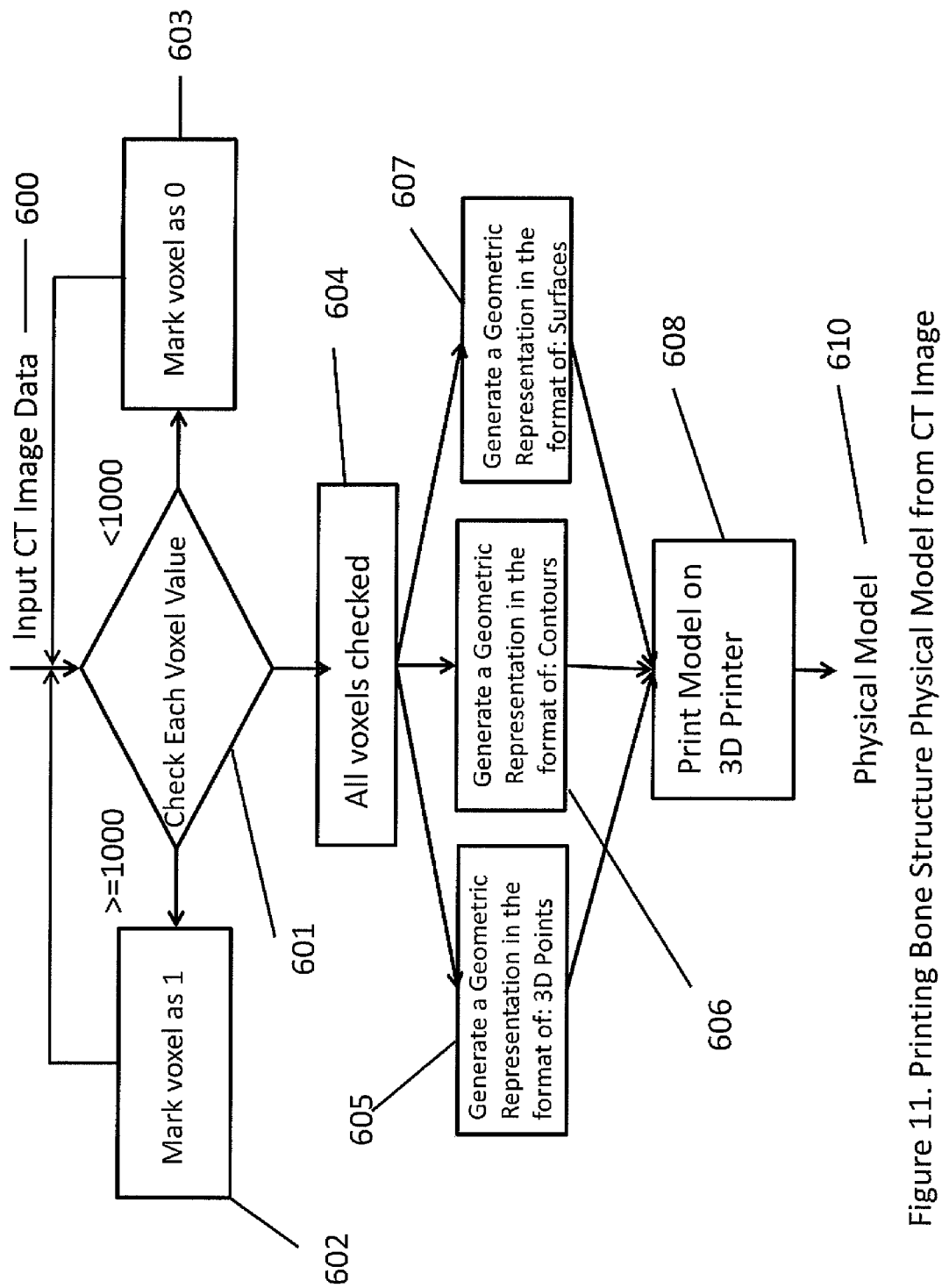
Figure 11. Printing Bone Structure Physical Model from CT Image

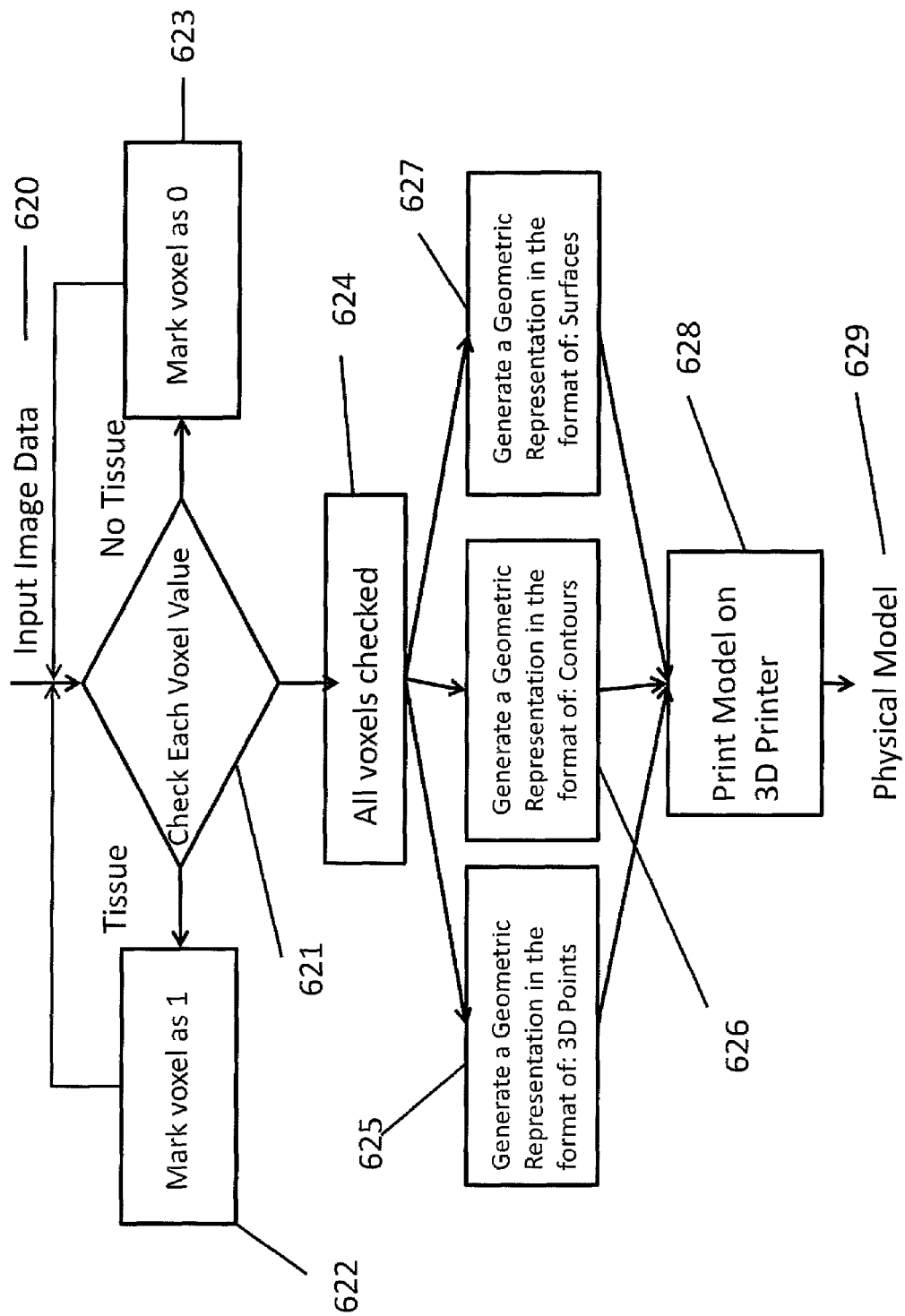
Figure 12. Printing Whole Body Structure Physical Model from An Image Set

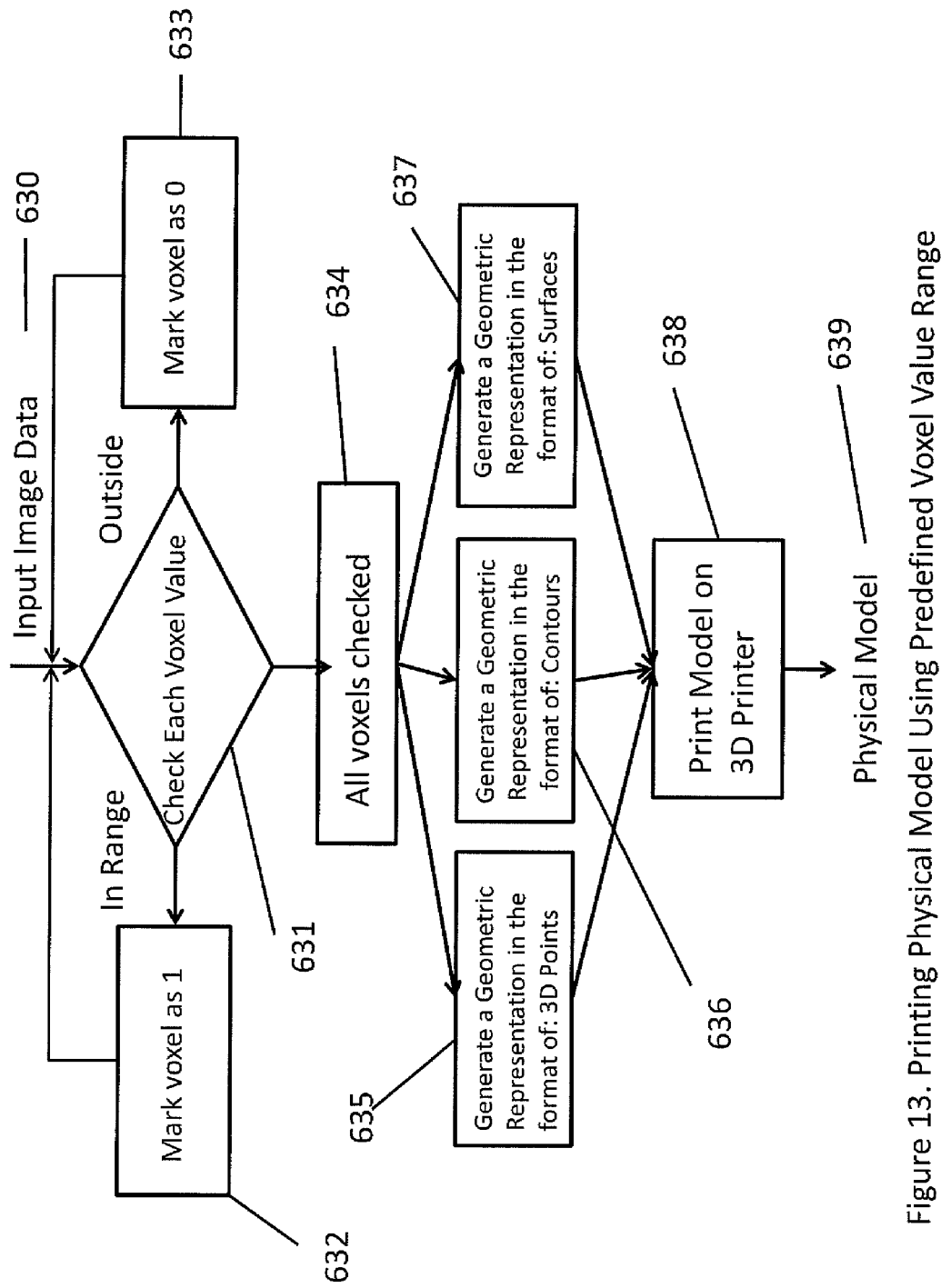
Figure 13. Printing Physical Model Using Predefined Voxel Value Range

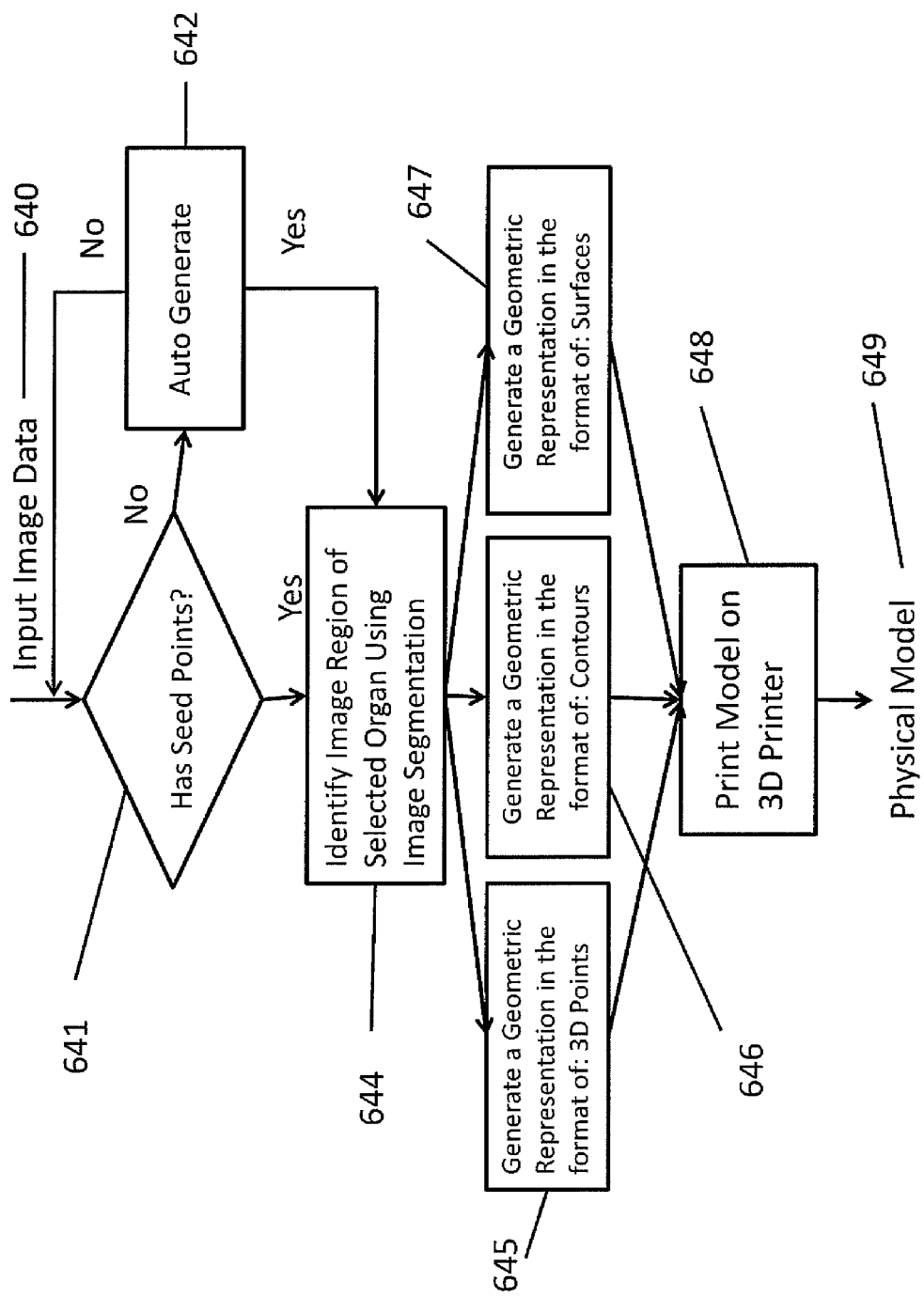
Figure 14. Printing Physical Model of Selected Organs

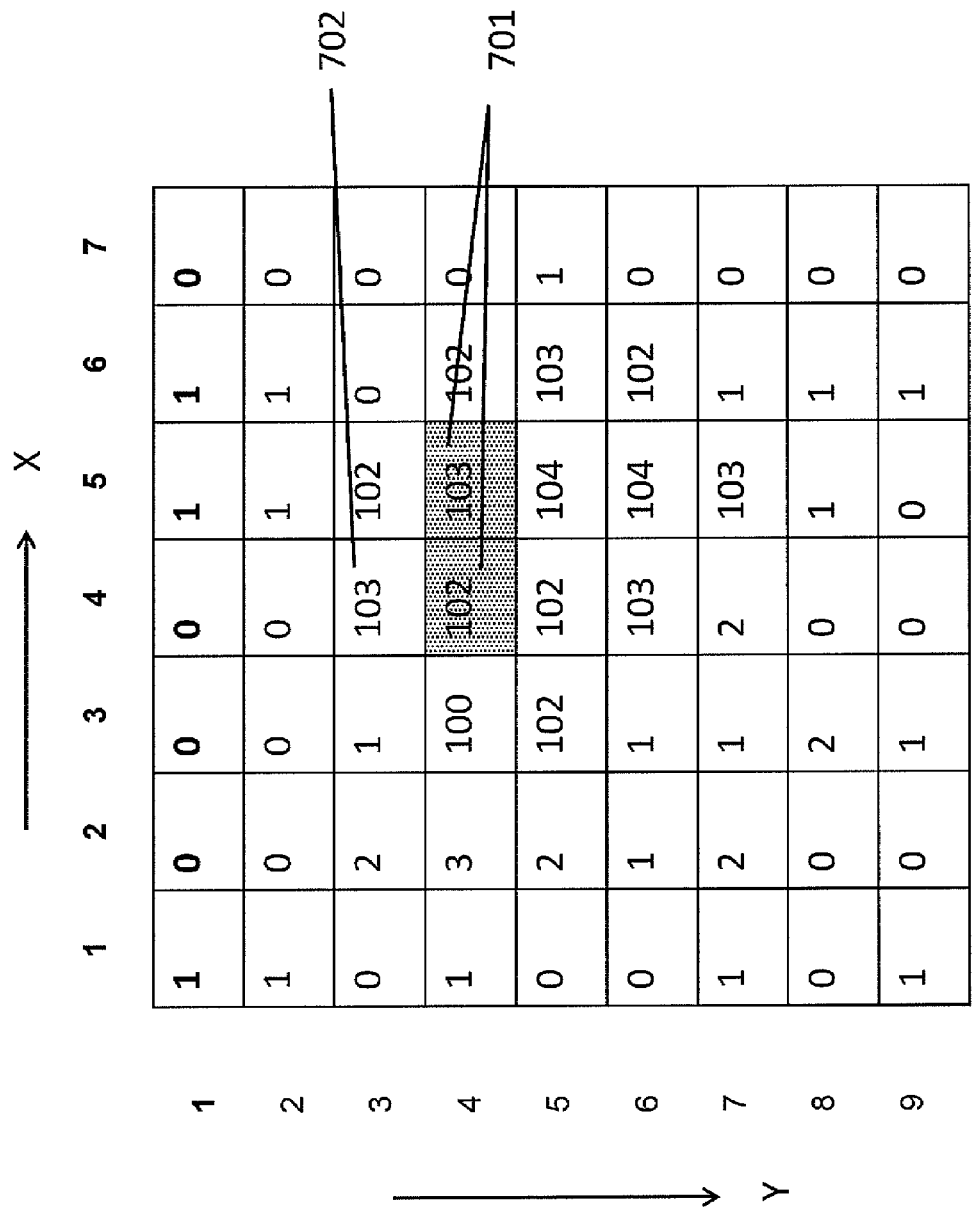
Figure 15. Image Segmentation: Image Example with Seed Voxels in Dark Color

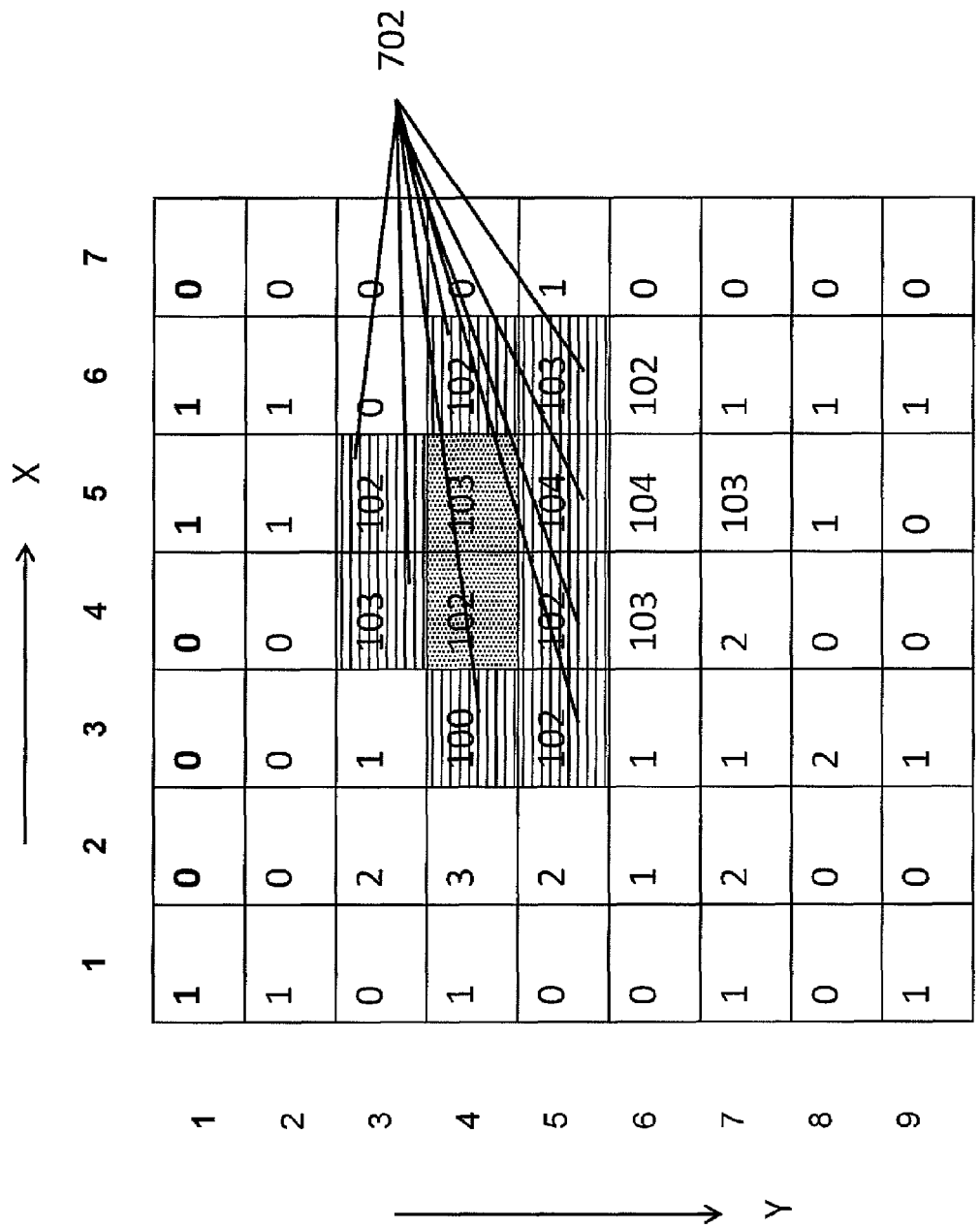
Figure 16. Image Segmentation: First Round of Region Growing

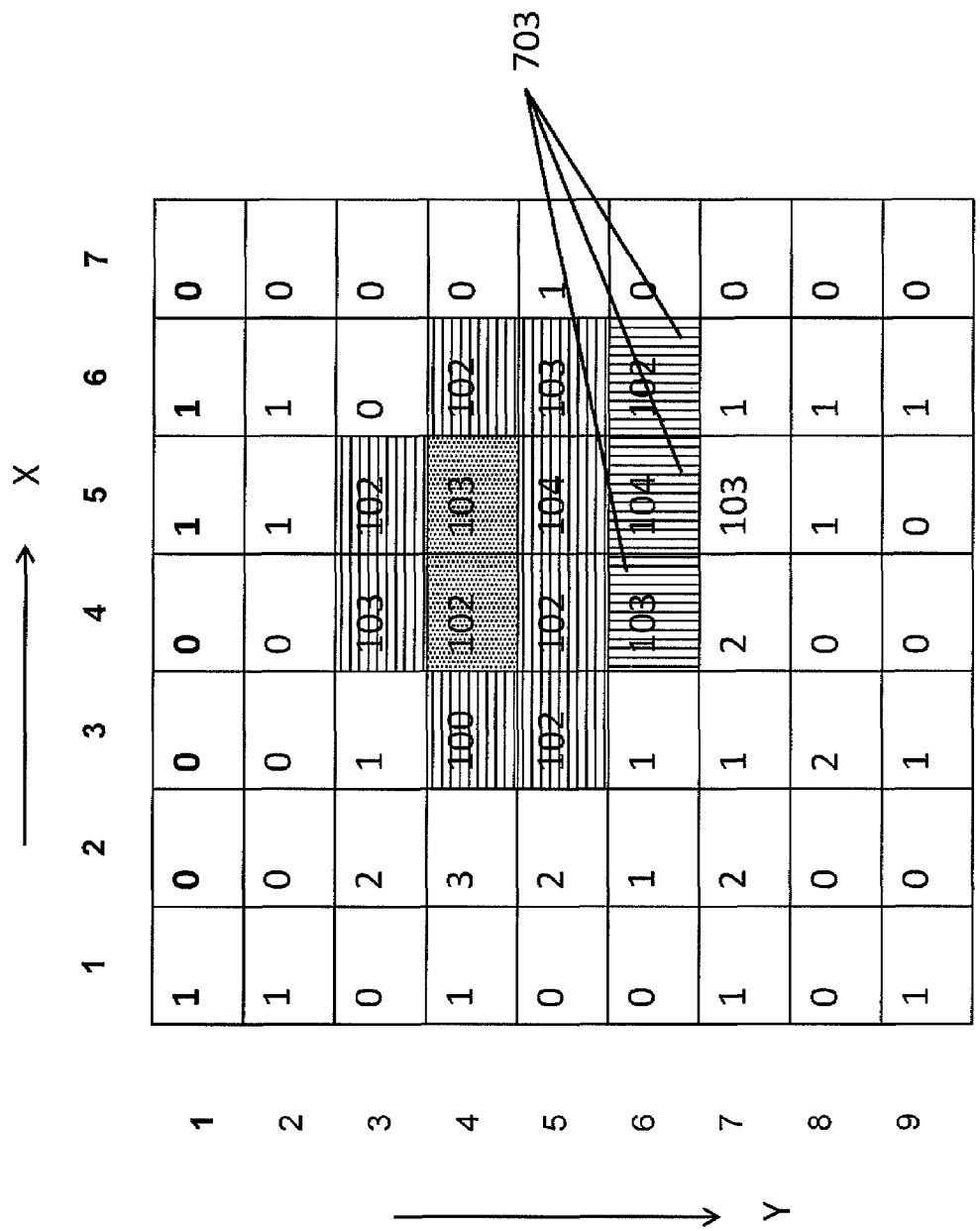
Figure 17. Image Segmentation: Second Round of Region Growing

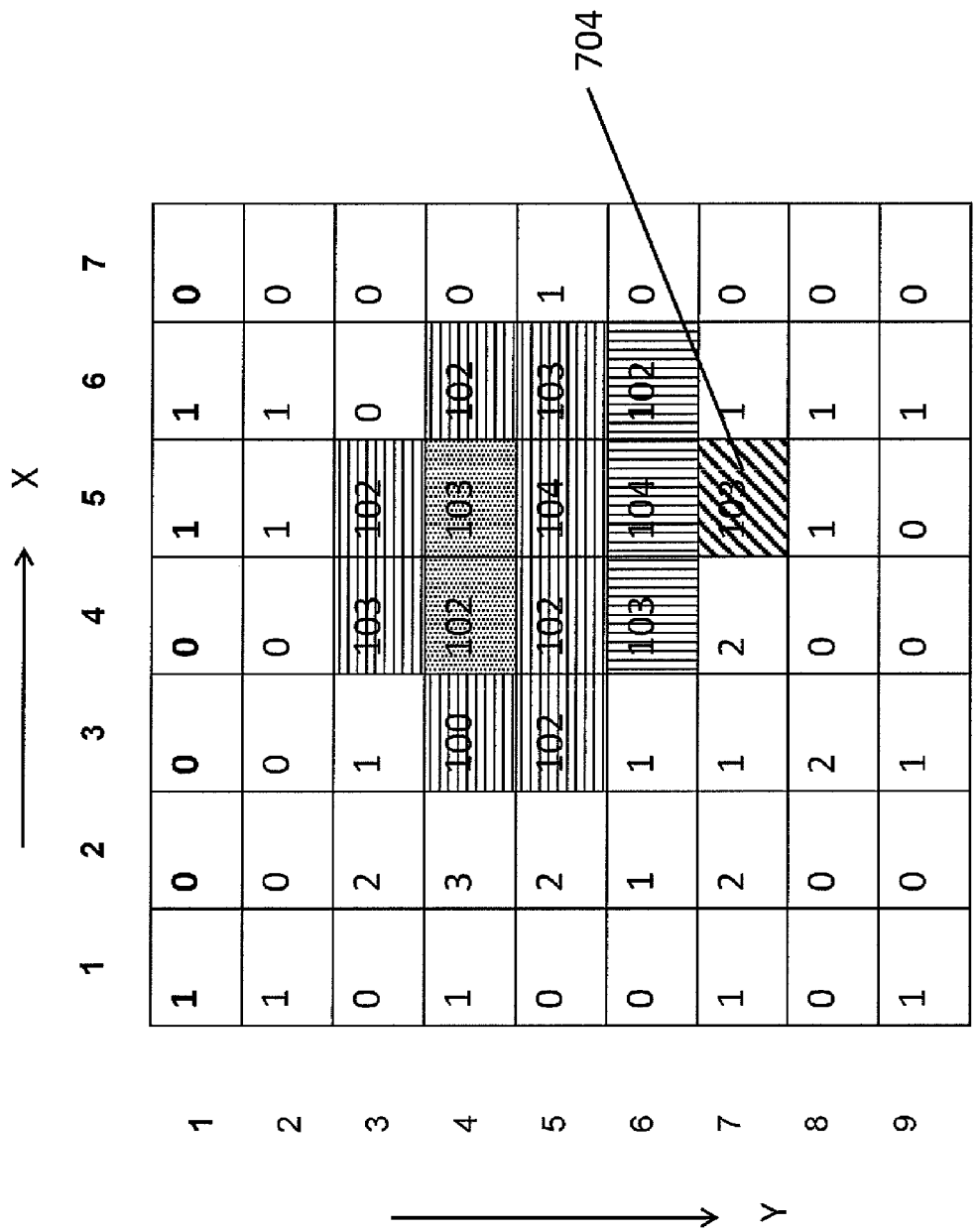
Figure 18. Image Segmentation: Last Round of Region Growing

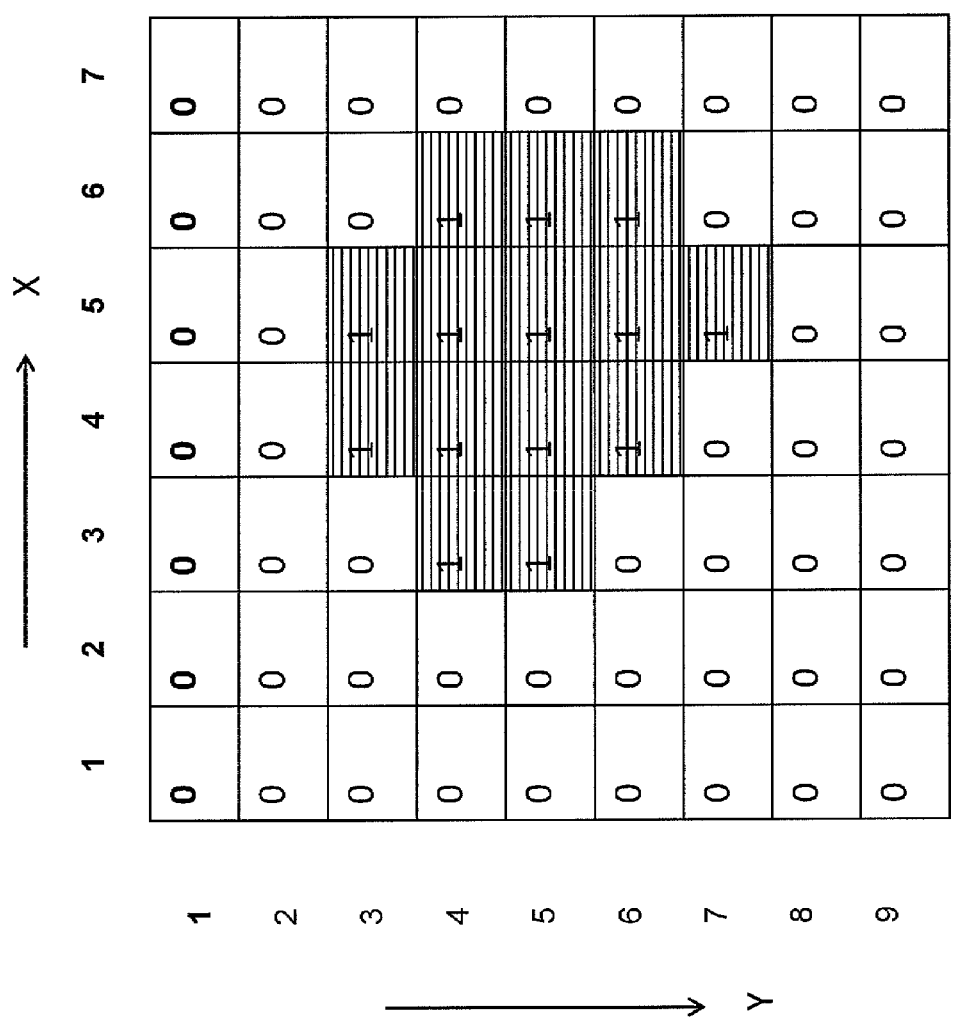
Figure 19. Image Segmentation: Final Result of Region Growing

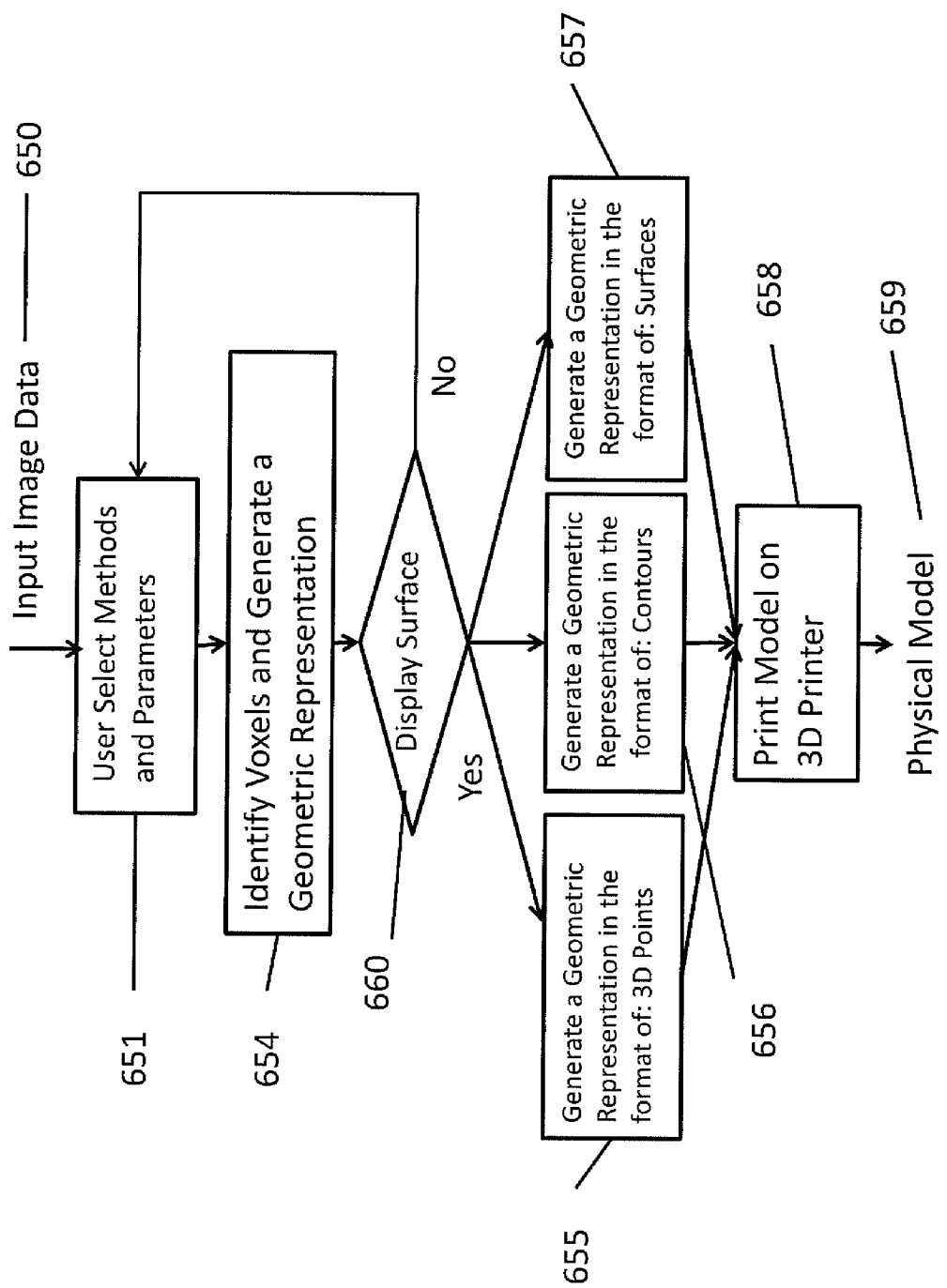
Figure 20. User Adjustable Physical Model Printing Method

SINGLE-ACTION THREE-DIMENSIONAL MODEL PRINTING METHODS

FIELD OF TECHNOLOGY

The present invention is in the technical field of three-dimensional ("3D") printing and rapid prototyping. In particular, the present invention is in the technical field of 3D printing and rapid prototyping using three or n-dimensional image data sets, such as CT (computerized tomography) or MRI (magnetic resonance imaging) images.

BACKGROUND

Three-dimensional ("3D") printing of physical models is useful in a wide variety of settings. Some potential uses include production of anatomical bodies like bones for research and clinical applications, medical product development, machine design, and equipment design, to name just a few. 3D printing or rapid prototyping refers to a collection of technologies for producing physical parts directly from digital descriptions. Digital descriptions include output of any software that produces a 3D digital model. One example of such software is Computer-Aided Design (CAD) software. Creating a 3D digital model from a 3D image data set requires specialized imaging or CAD software. Rapid prototyping machines have been commercially available since the early 1990's, the most popular versions of which build a desired structure by adding building material layer-by-layer based on a digital three-dimensional model of the structure.

However, because of the amount of user interaction time involved and the complexity of data conversion process between image data formats and data formats supported by 3D printers or rapid prototyping machines, applications of the present technology of producing 3D physical models from three or n-dimensional images are rather limited.

FIG. 1. illustrates the current method of creating a physical model from an input image data set. The input image data set comes in the form of 3D voxel data or serial, sequenced two-dimensional ("2D") images. A voxel (volumetric pixel or, more correctly, Volumetric Picture Element) is a volume element on a regular grid in a three dimensional space, having one or more numerical values as attributes such as intensity or color. This is analogous to a pixel (Picture Element), which has one or more numerical values as attributes on a regular grid in a 2D image data set. A 3D image data set may be organized as a series of 2D images and a voxel in a two-dimensional image plane may be referred to as a pixel.

In FIG. 1, when a user 11 needs to create a physical model 35 from an image data set 10, the user 11 looks up the image on his/her computer 15 and transfers the image data 10 to an image processing operator 21. The image processing operator 21 loads the image data 10 set on his computer 20 where special image modeling software is available. The image processing operator 21 reads the instructions sent by the user 11 to understand what type of model is required. If the image processing operator 21 still has questions or needs additional information, he will communicate with the user 11 to get the information. The image processing operator 21 then starts the process to create a 3D digital model 22 from the image data sets 10 on his computer 20 using specialized modeling software. The creation of the 3D digital model 22 requires a trained operator 21, specialized imaging software, and a significant amount of user interaction. The image processing operator 21 needs to communicate frequently with the user 11 who has ordered the physical model to understand the requirements and applications of the model. The image processing operator is also required to spend a significant amount of time to perform image segmentation and to trace manually certain image areas. After the 3D digital model 22 has been created, it is then saved to a file format supported by a 3D printer or rapid prototyping machine 30, for example, the STL (stereolithography) file format. The digital model file is then sent to the 3D printer or rapid prototyping machine 30 to generate a 3D physical model 35. The three-dimensional ("3D") printer 30 is likely located at a different location and operated by a 3D printing operator 31. When the physical model 35 is printed or fabricated, the 3D printing operator 31 sends it to the imaging processing operator 21 who then sends the finished physical model 35 back to the original user 11. The present 3D printing techniques are complex and cost ineffective. The physical models may take too long to create to be useful, for example, to an emergency-care doctor.

As a particular example of the need for an efficient 3D physical model printing process, we consider 3D printing applications in the medical field. In a typical application of 3D printing techniques in the medical field, medical images are first ordered and acquired on a hospital computer by a doctor. The doctor then sends the images to a trained image processing operator to create a digital model. The image processing operator communicates with the doctor to understand the requirements for the model. The image processing operator loads the image data set into a 3D image processing software to identify features such as bones, tissues, etc. by using image segmentation software tools. Because image processing of medical data is complex and time-consuming, it remains a challenging task even to a professional image processing operator.

After loading the image data, the image processing operator 21 then creates a digital 3D model, for example, a 3D polygonal surface model by using software-based modeling tools. As an example, one commercially available software solution, "3D-DOCTOR", can be used to produce 3D digital models of anatomical structures, as described in Yecheng Wu, *From CT Image to 3D Model*, Advanced Imaging, Aug. 2001, 20-23. After creating the digital 3D model, the image processing operator 21 sends the digital model to a 3D printing service provider. The 3D printing operator 30 at the 3D printing service provider loads the digital model data on his computer, controls the 3D printer to produce a physical model, and then delivers the finished physical model to the doctor who ordered the model. The above-described process is user intensitive and requires operators to possess advanced software training, knowledge of the intended applications, and a good understanding of the difference between image data formats and the various data formats supported by 3D printer and rapid prototyping machines.

In the above described process, one procedure employed in image processing is image segmentation. Image segmentation refers to the delineation and labeling of specific image regions in an image data set that defines distinct structures. Image segmentation may include steps such as differentiating a particular structure from adjacent material having different composition and identifying distinct objects having the same or similar composition. For example, when constructing bone models from Computerized Tomography ("CT") and/or Magnetic Resonance ("MR") images, bony structures need to be delineated from other structures (soft tissues, blood vessels, etc.) in the images. Also, each bone must typically be separated from adjacent bones when modeling anatomical structures such as cervical spine or foot.

In 3D printing applications in the medical field, a useful feature is the capability of building a prototype of a patient-specific anatomical region quickly. For example, if a patient comes in with a broken ankle, the surgeon may use a physical model of the bone fragments of the patient to aid surgical planning, if the physical model can be generated rapidly. For orthopedic surgeons, the ability to visualize and manipulate a physical model of a bone or joint in need of repair prior to surgery can aid in the selection and design of surgical implants for fracture fixation or joint replacement. Rapid prototyping of patient specific models increases efficiency and reduces costs by cutting operating room time. Rapid prototyping of patient specific models offers tremendous promise for improved pre-operative planning and preparation. While the technique of sizing surgical implants using newer imaging modalities such as Computerized Tomography ("CT") and/or Magnetic Resonance ("MR") imaging is an improvement over standard X-ray films, the ability to work with an accurate physical model of the region of interest would produce further benefits, such as providing tactile 3D feedback of the relevant patient anatomy. Rapid prototyping or 3D printing refers to a collection of technologies for producing physical parts directly from digital descriptions, which frequently are the output from Computer-Aided Design (CAD) software. Rapid prototyping machines have been commercially available since the early 1990's, and the most popular versions involve adding material to build the desired structure layer-by-layer based on a digital three dimensional model of the structure. For example, a physical model may be fabricated using a rapid prototyping system using stereolithography, fused deposition modeling, or three dimensional printing. In stereolithography, a laser is used to selectively cure successive surface layers in a vat of photopolymer. In fused deposition modeling, a thermal extrusion head is used to print molten material (typically a thermoplastic) that fuses onto the preceding layer. A typical three-dimensional printer uses a printer head to selectively deposit binder onto the top layer of a powder bed.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The present application discloses systems and methods for single-action printing of 3D physical models from a three or n-dimensional image data set. The methods may be applied to image data set obtained from any of a wide variety of imaging modalities, including Computerized Tomography ("CT"), Magnetic Resonance ("MR"), positron emission tomography ("PET"), optical coherence tomography ("OCT"), ultrasonic imaging, X-ray imaging, sonar, radar including ground penetrating radar, acoustic imaging, microscopy imaging, simulated image data and the like, or combinations of one or more imaging modalities. The systems and methods are applicable to a wide range of applications from creating physical models of anatomical structures such as bones and organs to creating physical models of mechanical components, archaeological sites, and natural geological formations.

The systems and methods described herein generally contemplate combining printing template methods with a 3D printer or rapid prototyping machine. The printing template methods usually include predefined data processing steps comprising identifying voxels in an image data set, generating a geometric representation, and sending the geometric representation to the 3D printer to produce a 3D physical model. A 3D printer or rapid prototyping machine refers to a collection of devices capable of producing three-dimensional physical parts directly from digital models using stereolithography, fused deposition modeling, three dimensional printing, sheet laminating or other technologies.

DESCRIPTION OF THE DRAWINGS

FIG. 5 illustrates a list of 3D printing templates accompanied and described with text.

FIG. 6 illustrates a list of 3D printing templates accompanied and described with text and graphics.

FIG. 7 illustrates 3D points as an exemplary geometric representation generated by a printing template from image data.

FIG. 8 illustrates a 3D contour as an exemplary geometric representation generated by a printing template from image data.

FIG. 9 illustrates a 3D triangle-based surface model as an exemplary geometric representation generated by a printing template from image data.

FIG. 10 provides a table of sample CT numbers for various human tissues.

FIG. 11 illustrates an exemplary printing template of printing a bone structure from a CT image data set.

FIG. 12 illustrates an exemplary printing template of printing a solid body structure from an image data set.

FIG. 13 illustrates an exemplary printing template of printing a physical model using predefined value ranges from an image data set.

FIG. 14 illustrates an exemplary process of printing a physical model of selected organs or parts from an image data set.

FIG. 15 illustrates an exemplary image with seed voxels marked before image segmentation.

FIG. 16 illustrates a segmentation result of a first round region growing.

FIG. 17 illustrates a segmentation result of a second round region growing.

FIG. 18 illustrates a segmentation result of a last round region growing.

FIG. 19 illustrates a segmented image using a region growing technique.

FIG. 20 illustrates an example of user adjustable physical model printing method.

DETAILED DESCRIPTION

Certain specific details are set forth in the following description and figures to provide a thorough understanding of various embodiments of the invention. Certain well-known details often associated with computing and software technology are not set forth in the following disclosure, however, to avoid unnecessarily obscuring the various embodiments of the invention. Further, those of ordinary skill in the relevant art will understand that they can practice the invention without one or more of the details described below. Finally, while various methods are described with reference to steps and sequences in the following disclosure, the description as such is for providing an implementation of embodiments of the invention, and the steps and sequences of steps should not be taken as required to practice this invention.

Figure 1:
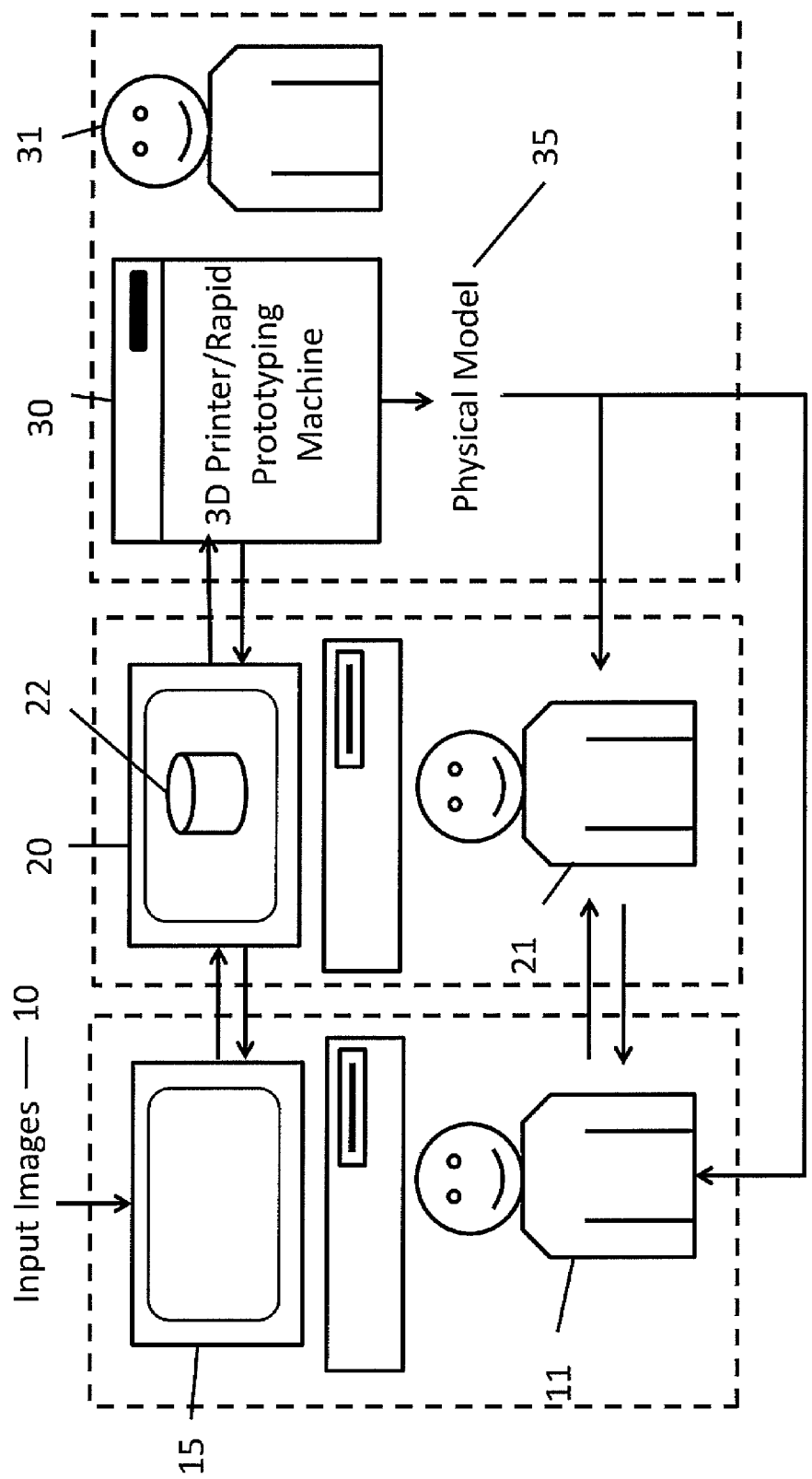
FIG. 1 illustrates a current method of printing a 3D model from an image data set.
Figure 2:
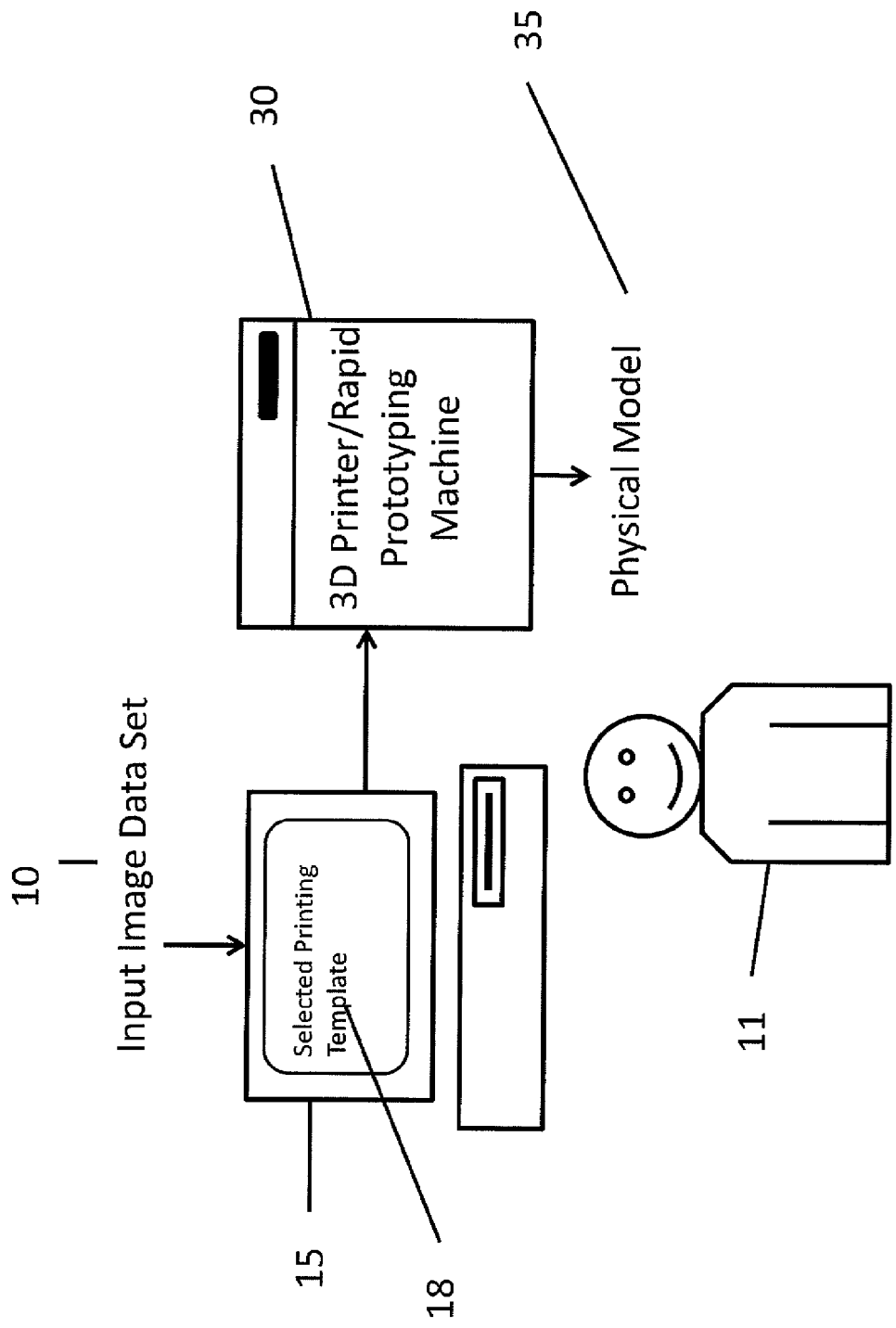
FIG. 2 illustrates a proposed method for printing a 3D model from an image data set.

FIG. 2 illustrates an exemplary system using a single-action 3D printing method to print a 3D physical model from an input image data set 10. The 3D model can be, for example, a patient-specific anatomical model. First, the image data set 10 such as CT data, MR data etc, is loaded on a computer 15. The image data set 10 is typically a voxel-based image data set depicting a 3D region with each voxel of the image data set 10 encoding at least one image attribute, such as image intensity, color or the like. A user 11 at the computer 15 selects one printing template 18 from a list of printing templates (300 in FIG. 5) for printing a 3D physical model. The computer 15 applies the selected printing template 18 to identify voxels in the image data, generate a geometric representation in a data format supported by a 3D printer, and send the data to a connected or networked 3D printer 30 for producing a physical model 35. For example, the 3D printer 30 may comprise a rapid prototyping device as discussed above. The 3D printer 30 may be connected to the computer directly through a local computer port, local area network, or the Internet.

When a 3D printer 30 is not directly connected to the computer where a printing template is used, the data generated from the printing template may be saved to a storage media (for example, a CD or DVD) or storage device (for example, a external hard drive). The saved data can then be ported to the 3D printer 30 to generate the physical model 35.

Figure 3:
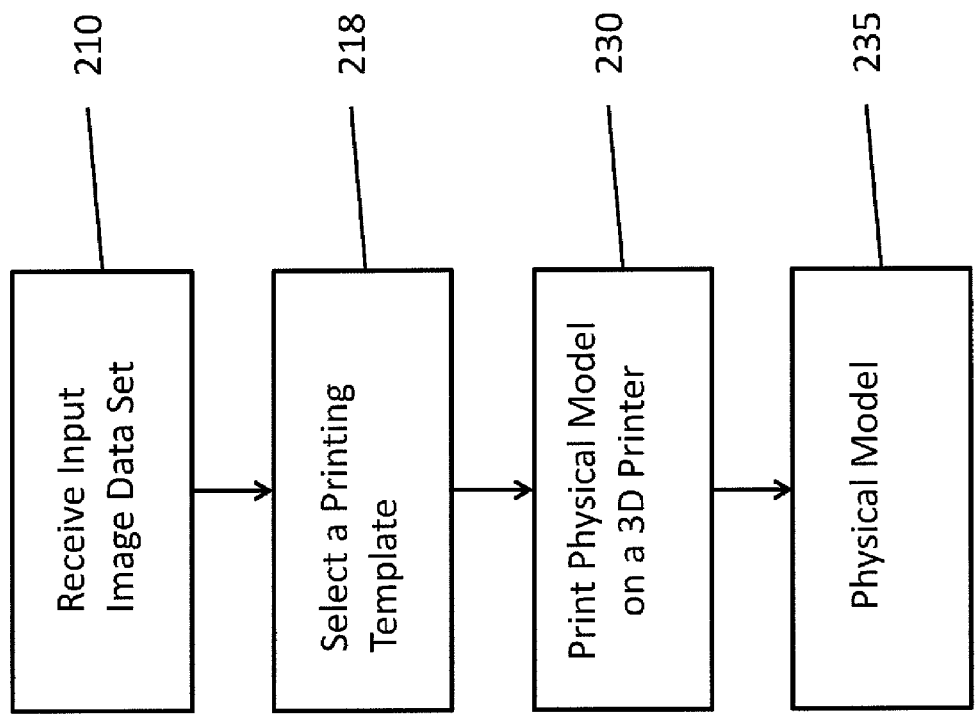
FIG. 3 illustrates a flowchart of an exemplary single-action 3D model printing method.

FIG. 3 is a flowchart of a single-action 3D printing method. In FIG. 3, an image data set 10 is first received in step 210. In step 218, a selected printing template 18 is executed to identify the voxel categories and generate a geometric representation for printing a 3D model. In step 230, the generated geometric representation is sent to a 3D printer 30 and in step 235, a 3D physical model 35 is produced.

In FIG. 3, step 218 represents a single user action involved in the printing process of a 3D model. In step 218, selecting a printing template includes a selection action by using a pointing device to position on a specific printing template from a list of predefined printing templates and select the printing template for execution. The single-action may be a clicking of a mouse button when a cursor is positioned over a predefined area of a displayed list of printing templates or a depressing of a key on a key pad to select a specific printing template.

A printing template as defined herein is a software program for identifying voxels in an image data set, generating a geometric representation of a 3D physical model in a data format supported by a 3D printer, and sending the geometric representation to a 3D printer to create a 3D physical model.

In general, 3D printers require a geometric representation of an object in order to fabricate the geometric shapes required in making a 3D physical model. The geometric representation of an object may include one or a combination of the following forms: a list of 3D points 501-506 for the entire body of the object with locational and material information defined at each 3D point (FIG. 7), a group of 3D contours 552-561 to define the shape of the object on each image plane (FIG. 8), or surface models 580 (FIG. 9) consisting of triangles or polygons or surface patches delineating the body of the object.

In the present application, a 3D physical model 35 may have one or more pieces and one or multiple colors, and may be made of one or multiple materials. The conversion process from input image date set to a geometric representation understood by a 3D printer may be either dependent on or independent of imaging modality or any other image information. A printing template may be implemented as a software program on a computer, a computer processing board, or the controller board of a 3D printer. It may be implemented as but not limited to: a program script file with processing instructions and parameters, a binary executable program with processing instructions and parameters, a dynamically linked library (DLL), an application plug-in, or a printer device driver. A printing template may be implemented as a stand-alone solution or a component of a system used for printing 3D physical model from image data sets. A printing template program may be loaded locally on a user's computer or reside on a remote server connected through computer network.

Figure 4:
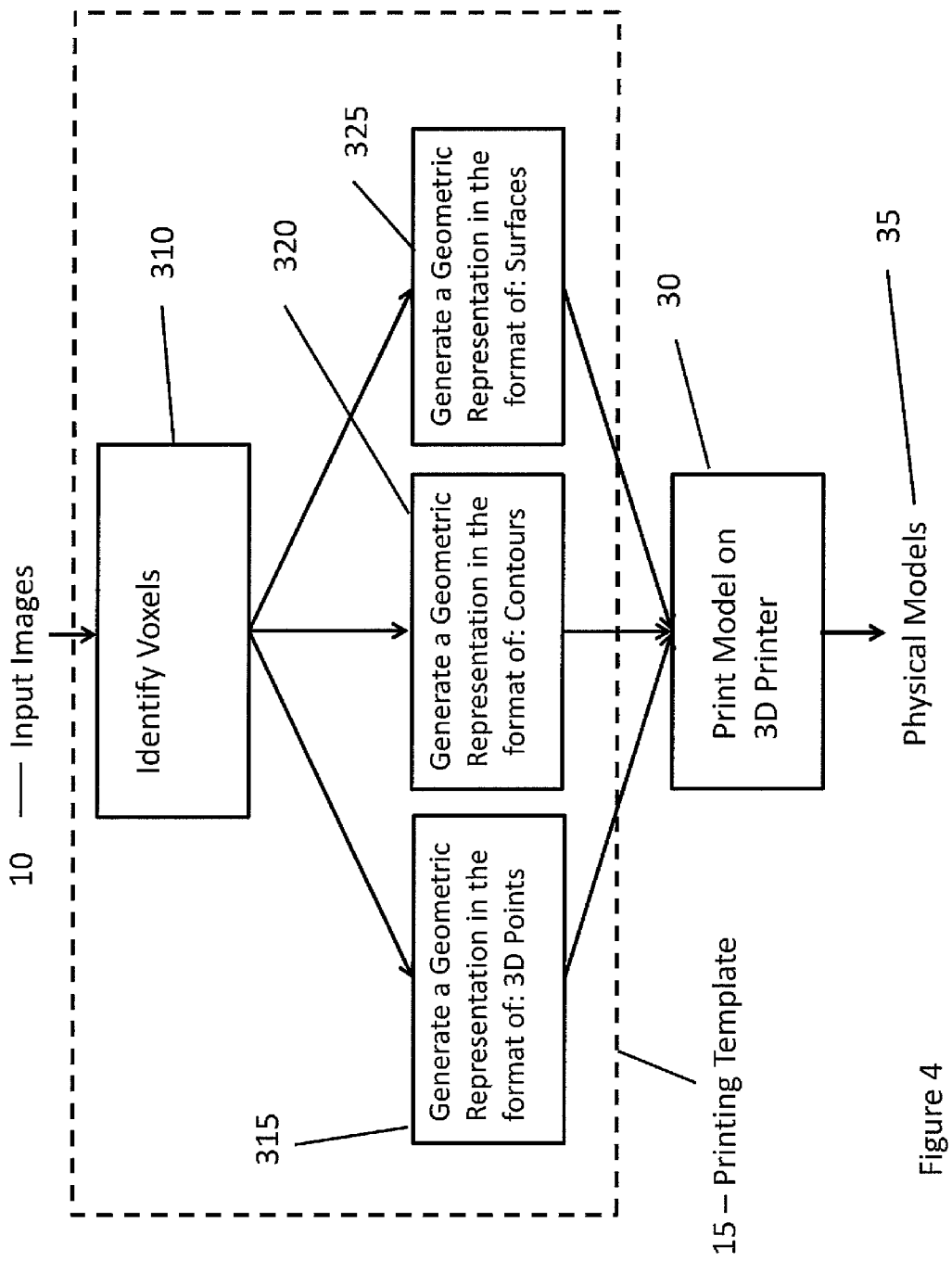
FIG. 4 illustrates a flowchart of image data conversion steps included in a printing template.

FIG. 4 illustrates a flowchart of the image data conversion step in a printing template. An input image data set 10 is received by a printing template 15. The printing template starts its predefined voxel identifying function 310 to identify voxel categories in the image data. After identifying the voxel categories, the printing template generates one of three geometric representations (3D points 315, 3D contours 320 or surface models 325) supported by a 3D printer and sends the generated geometric representation to the 3D printer 30 to produce a 3D physical model 35.

The image data conversion process generates a geometric representation and any additional data needed for a 3D printer to print out the physical model. The voxel identifying process is generally done using image processing techniques such as image segmentation and classification. One purpose of image segmentation and classification is to identify the voxel categories at each voxel location for the entire image data set. Commonly used image classification techniques include trained classifiers (such as artificial neural networks), image clustering using voxel similarity measures, etc. Commonly used image segmentation techniques include image thresholding, histogram thresholding, region growing, region splitting, watershed method, graph partitioning, clustering, artificial neural network, and other methods.

The geometric representation generated from the input image data set for 3D printing may be a list of 3D points 501-506 in the body of an object with locational and material information (FIG. 7) specified at each point, or a set of 3D contours 551-561 to define the shape of an object in the image planes (FIG. 8), or surface models of an object 580 (FIG. 9), or a combination of them. The data generated for 3D printing is not limited to geometrical representations such as points, contours or surfaces as described. The data may also be organized as a list of printing instructions, such as "move to a location", "deposit a specified amount of building material", "move to a new location", etc., that can be used to complete the physical model printing process.

The list of printing templates may be displayed as either text 300 (FIG. 5) or graphics 301 (FIG. 6) on the computer 15. For example, the text may use a description such as "bone structure" or "brain." The graphic display may use pre-drawn graphic icons to indicate "bone", "skull", or "brain." The graphic display of a printing template may also use a 3D graphic rendering of the geometric representation generated from the image data by the printing template. The number of printing templates is not limited. Additional printing templates may be added for specific physical model printing needs. New printing templates may be created with different processing steps and parameters. A printing template may also be implemented as a part of the input image; in which case user interaction is not required. For example, when the input image is received with a specific printing template attached, the printing process starts automatically by executing the attached printing template. The execution of the attached printing template may include steps of first generating a geometric representation from the image and then producing a physical model without any user interaction.

As described above, rapid prototyping systems build a physical model by adding consecutive layers, as opposed to subtractive rapid prototyping or conventional machining that uses a tool to remove material from blank stock. However, generation of a physical model may just as well use other processes and equipment. For example, rapid prototyping processes may be adapted to produce functional objects ("parts") rather than just geometric models. In such case, rapid prototyping may be referred to by the alternative names such as additive fabrication, layered manufacturing, and solid free form fabrication.

Many commercial rapid prototyping machines currently employ standard input formats comprising of a polygonal representation of the boundary of the object. For example, a CAD model or other three-dimensional ("3D") digital model is converted to a list of triangles defining the surface of the object. The machine slices through the collection of triangles to generate a geometric representation that comprises the boundary of each layer to be printed or deposited. In the following sections, different embodiments of 3D printing templates are discussed.

(1) Printing Bone Structure from CT Image Date Set

This embodiment is implemented as a printing template for printing a physical model of a bone structure from a CT image data set.

In a CT image, the intensity value at each voxel may be converted to a value in Hounsfield units (HU). The Hounsfield unit system measures the attenuation coefficient of tissues in computerized tomography. Hounsfield units are also termed CT numbers. FIG. 10 provides a table of sample CT numbers for various human tissues. The table lists some of the voxel values of different tissues or materials in Hounsfield units for a typical CT scanner. The values may differ on a different CT image scanner due to specific settings on that particular imaging device and custom calibrations of image data. The formula to calculate the CT number in Hounsfield units from the voxel intensity is normally provided as part of the image data. For example, the formula used by many CT scanner vendors is:

HU=Voxel Intensity*Scale+Intercept;

where HU is the voxel value in Hounsfield units, Voxel Intensity is the attribute value of each voxel provided in an image data set, and Scale and Intercept are parameters provided with the formula. For example, for many CT images, Scale=1 and Intercept=−1000. Other values for Scale and Intercept may also be used.

As indicated in the table of FIG. 10, bone tissues may be identified using a range of CT numbers (>1000). The value of every voxel in the image data set can be checked to identify bone tissues. For example, if a voxel has a value above 1000 HU, it is marked as bone tissue. Often an upper limit is used to prevent other hard materials such as metal implants from being marked as bone tissue. A similar technique may be applied to other tissues, such as soft tissue (fat, muscle, etc), blood, liver tissue, and white and grey matter in the brain.

FIG. 11 is a flowchart of an exemplary printing template for printing bone structures from a CT image set. The printing template identifies voxels that are part of the bone structure in the CT image 600, generates a geometric representation (in the format of 3D points 605, Contours 606, 606, or Surfaces 607) in a 3D printer supported data format and sends the geometric representation to the 3D printer 608 to generate a physical model 610. The printing template includes the following processing steps:

a) Go through the entire image data set 600 to check the HU value of each voxel (Step 601).

b) For each voxel with a HU value larger than 1000 HU but less than an upper bound, mark the voxel with value 1 to indicate the voxel as representing bone tissue (Step 602). Otherwise, mark it with value 0 to indicate non-bone tissue (Step 603). Repeat Step "a" and "b" until all voxels are checked, in which case a geometric representation is generated (Step 604). The value 1000 HU is used here as an example. Different values or ranges may be used for different images.

c) If the 3D printer (608) supports input data in the format of 3D points, a geometric representation comprising a list of 3D points for all voxels marked with value 1 may be generated (Step 605) and sent to the printer (Step 608) to generate a physical model 610. If other information such as material or color is supported, we may include the other information in the geometric representation. FIG. 7 shows an example of the 3D points generated from an image data set. In this example, every 3D point has an identification value which is either 0 or 1. In this case, 0 indicates non-bone tissue and the voxels with value 0 are represented here by a white color. 1 indicates bone tissue and the voxels with value 1 are represented here by a dark color. In other embodiments, every voxel may have one or multiple identification values which may be any value, not limited to 0 or 1.

In FIG. 7, the list of 3D points are represented as:

Point 501: (5, 0, 0, 1)
Point 502: (5, 1, 1, 1)
Point 503: (4, 1, 1, 1)
Point 504: (4, 2, 2, 1)
Point 505: (5, 2, 2, 1)
Point 506: (4, 3, 2, 1)

where each point has a data format of (X, Y, Z, Value). X, Y, Z are the three-dimensional coordinates of a voxel and Value is the attribute with a value of, in this case, 1 for all the voxels identified as bone tissue and 0 otherwise. Other values may be used for identification purposes. Additional values may be also used to indicate attributes such as color or material.

d) If the 3D printer supports input data in the format of 3D contours, a geometric representation comprising the contours are generated by tracing along the outer edge of all voxels marked with the value of 1 (Step 606). The contour tracing method is straight forward, and is normally done by walking along the edge voxels in a fixed order within each 2D image plane. For example, we may start the walk on an edge voxel and follow the next edge voxel in a clockwise fashion until the starting position is encountered. The walking process is then repeated for all image planes. FIG. 8 shows an example of tracing a contour in a 2D image plane. In this example, the tracing process starts at one edge voxel 551 and the contour starts with no point data. Voxel 551 is added to the contour as the starting point. In a clockwise order, the next voxel on the edge to be traced is voxel 552. Voxel 552 is added to the contour. Repeat the process to add voxels 553, 554, 555, 556, 557, 558, 559, 560 and 561 to the contour. When the next edge voxel is the starting point (Voxel 551), the tracing process for this contour is complete. The contour may be represented as:

551: (4, 5, N, 1)—Start Point
552: (5, 5, N, 1)
553: (6, 5, N, 1)
554: (7, 5, N, 1)
555: (8, 4, N, 1)
556: (7, 3, N, 1)
557: (6, 3, N, 1)

558: (5, 3, N, 1)
559: (4, 3, N, 1)
560: (3, 3, N, 1)
561: (3, 4, N, 1)—End Point
where each point has a data format of (X, Y, Z, Value). X, Y, Z are the three-dimensional coordinates of a voxel and Value is the attribute with a value of, in this case, 1 for all the voxels identified as bone tissue and 0 otherwise. Other values may be used for the attribute and additional attributes such as color or material may be included as well. In this example, the particular tracing technique is described as an example. Other tracing methods and variations may be used to generate similar results.

e) If the 3D printer supports input data in the format of a surface model, then a geometric representation in the format of a surface model is generated using the "Marching Cubes" (U.S. Pat. Nos. 4,710,876, 4,751,643, 4,868,748) method or other surface modeling methods (Step 607). The generated geometric representation is sent to the 3D printer to produce a physical model 610 (Step 608). Most commercially available 3D printers and rapid prototyping machines support the "STL" format, which stores surface geometry data as a set of raw unstructured triangles. For this example, the surface model 607 is sent to the three-dimensional ("3D") printer in the "STL" format.

"Marching cubes" is a computer graphics algorithm for extracting a polygonal mesh of an isosurface from three-dimensional voxels. The algorithm proceeds through the voxels marked with 1, taking eight neighbor locations at a time (thus forming an imaginary cube) and then determining the polygon(s) needed to represent the part of the isosurface that passes through this cube. The individual polygons are then fused into the desired surface. The "Marching Cubes" algorithm generates triangle-based surface models. Additional post processing steps such as surface smoothing and surface decimation may be applied to improve the surface quality but are not required.

FIG. 9 shows an example of a three dimensional triangle-based surface model 580. In this example, the triangle-based surface model has 8 vertexes: P0, P1, P2, P3, P4, P5, P6, P7 and 12 surface triangles with T1, T2, T3, T4, T5, T6 displayed at the front of the model and T7, T8, T9, T10, T11, T12 displayed at the back of the model. Each vertex is a 3D point: (X, Y, Z). Each triangle has 3 vertexes, for example (P0, P2, P1). This surface model may be represented as:

Triangle 1-T1, Front: (P0, P2, P1)
Triangle 2-T2, Front: (P1, P2, P3)
Triangle 3-T3, Front: (P2, P4, P3)
Triangle 4-T4, Front: (P4, P2, P0)
Triangle 5-T5, Front: (P4, P0, P5)
Triangle 6-T6, Front: (P5, P0, P7)
Triangle 7-T7, Back: (P6, P0, P7)
Triangle 8-T8, Back: (P6, P1, P0)
Triangle 9-T9, Back: (P6, P3, P1)
Triangle 10-T10, Back: (P6, P4, P3)
Triangle 11-T11, Back: (P6, P5, P4)
Triangle 12-T12, Back: (P6, P7, P5)

In this example, the surface model representation is similar to the commonly used "STL" format and may be sent to the 3D printer in the "STL" format for printing a physical model. Other representations and variations, such as surface patches or polygon-based surfaces, may also be used.

The above example describes one embodiment of the single-action 3D image printing methods. The steps in the printing template may be combined or varied. For example, the voxel checking and marking Steps "a" and "b" can be combined into Step "e" that checks the voxel values and generates the surface triangles without marking the voxels.

(2) Printing Solid Body Structure from an Image Data Set

This embodiment is implemented as a printing template for printing a physical model of a solid body from an image data set.

For a known imaging modality, such as Computerized Tomography ("CT") or Magnetic Resonance ("MR") imaging, the voxels in an empty or no-tissue region in an image typically have a known value range. For example, air would be considered a no-tissue region. A voxel representing air has a value range around −1000 HU as shown in the CT values table (FIG. 10). In other words, we can check the value of each voxel in the image data set to identify whether the voxel represents an empty region or not. For example, if a voxel in a CT image has a value between −1000 HU and −200 HU (the value below the lowest tissue value in Hounsfield unit), the voxel may be identified as air. Otherwise the voxel may be identified as body tissue. The same method may be applied to other imaging modalities to identify empty regions that are defined with known voxel value ranges.

FIG. 12 illustrates an exemplary printing template for printing a solid body structure from an image data set. The printing template identifies voxels (Step 621) in empty regions and body regions in the image, generates a geometric representation (Steps 625, 626, or 627), and sends the geometric representation to the 3D printer to create a physical model 629 (Step 628). The printing template includes the following processing steps:

a) Go through the entire image data set 620 to check the value of each voxel in Hounsfield units (Step 621).

b) For each voxel, if its value is within the value range of no-tissue (empty region, for example, air), mark the voxel with value 0 to indicate it is empty (Step 623). Otherwise, mark it with value 1 to indicate it has tissue (Step 622). Repeat Step "a" and "b" until all voxels are checked, in which case, a geometric representation is generated (Step 624).

c) If the output printing device supports input data in the format of 3D points, we then generate a list of 3D points for all voxels marked with value 1 (Step 625) and send the list to the printer to generate a physical model 629 (Step 628). If other information such as material or color is supported, we can extract such information from the input image data and send it together with the geometric representation in the format of 3D points. See FIG. 7 for an example of the 3D points generated from an image data set.

d) If the 3D printer supports input data in the format of contours, then a geometric representation may be generated by tracing the contours along the outer edge of all voxels marked with value 1 (Step 626). See FIG. 8 for an example of tracing a contour in a 2D image plane.

e) If the 3D printer supports input data in the format of a surface model, then a geometric representation in the format of a surface model is generated (Step 627) using the "Marching Cubes" (U.S. Pat. Nos. 4,710,876, 4,751,643, 4,868,748) method or other surface modeling methods. The geometric representation is then sent to the 3D printer to produce a physical model 629 (Step 628).

The above example describes one embodiment of the single-action 3D image printing methods. The steps in the printing template may be combined or varied, for example, the voxel checking and marking Steps "a" and "b" can be combined into Step "e" that checks the voxel values and generates the surface triangles without marking the voxels.

(3) Printing Physical Model Using Predefined Voxel Value Ranges

This embodiment is implemented as a printing template for printing a physical model from an image data set using predefined voxel value ranges.

FIG. 13 illustrates an exemplary printing template for printing a physical model from an image data set 630 using one or more predefined voxel value ranges. A predefined value range may be in voxel intensity, color, texture, location, region, or any derived value from them. A typical range has a low value and a high value to define the bounds of the range. A list of ranges may be used to define multiple value ranges that are not adjacent to each other.

In this embodiment, the method identifies voxels using the predefined voxel value range (Step 631), generates a geometric representation (Steps 635, 636, or 637), and sends the data to the 3D printer to generate a physical model 639 (Step 638). It includes the following steps:

a) Go through the entire image data set to check the value of each voxel against the value ranges defined in the printing template (Step 631).

b) For each voxel with a value within the bound of one of the defined ranges, mark the voxel with value 1 to indicate it is within the specified range (Step 632). Otherwise, mark with value 0 to indicate it is outside (Step 633). Repeat Step "a" and "b" until all voxels are checked and identified. A geometric representation is generated in Step 634.

c) lithe 3D printer supports input data in the format of three-dimensional points, we generate a geometric representation comprising a list of 3D points for all voxels marked with value 1 (Step 635) and send the geometric representation to the 3D printer (Step 638) to create a physical model 639. If other information such as material or color are supported in the input image data 630, we may include the information and send it together with the geometric representation to the printer. FIG. 7 shows an example of the 3D points generated from an image data set.

d) lithe 3D printer supports input data in the format of contours, a geometric representation can be generated by tracing the contours along the outer edge of all voxels marked with value 1 (Step 636). See FIG. 8 for an example of tracing a contour in a 2D image plane.

e) If the 3D printer supports input data in the format of a surface model, a geometric representation may be generated using the "Marching Cubes" (U.S. Pat. Nos. 4,710,876, 4,751,643, 4,868,748) method or other surface modeling methods (Step 637). The geometric representation is then sent to the 3D printer (Step 638) to produce a physical model 639. Most commercially available 3D printers and rapid prototyping machines support the "STL" format, which stores surface geometry data as a set of raw unstructured triangles. In a particular example, the surface model 637 is sent to the 3D printer in the "STL" format.

The above example describes one embodiment of the single-action 3D image printing methods. The steps in the printing template may be combined or varied. For example, the voxel checking and marking Steps "a" and "b" can be combined into Step "e" that checks the voxel values and generates the surface triangles without marking the voxels.

(4) Printing Physical Model of Selected Organs or Parts

This embodiment is implemented as a printing template for printing a physical model of selected organs or parts from an image data set.

FIG. 14 illustrates an example of printing a physical model 649 of selected organs or parts from an image set 640. To generated a physical model of selected organs or parts, the image regions of the selected organs need to be identified using image segmentation techniques (Step 644). A typical segmentation technique used for identifying specific image regions starts with either a set of automatically generated (Step 642) or user selected seed locations or regions (Step 641), grows each region by merging neighboring voxels that are within a certain similarity criterion, and repeats the process until no more neighboring voxels are available for merging. For example, the criterion could be a difference of voxel intensity, gray level, texture, or color between the voxels already identified and the ones being checked. After the identification process is complete, the identified regions are then used to generated a geometric representation for the 3D printer. Other image segmentation methods, such as region growing, active contours, graph partitioning, watershed, and clustering, may be used in the image region identifying step of this embodiment.

In this example, the method identifies voxels using a region growing technique (Step 644), generates a geometric representation of the identified voxels in a format supported by a 3D printer 648 (Steps 645, 646, or 647) and sends the geometric representation to the 3D printer to generate a physical model of selected organs or parts 649 (Step 658).

In this embodiment, a user 11 (referenced in FIG. 2) selects some voxels or regions on the input image as seed voxels or regions. FIG. 15 illustrates an example where two selected seed voxels 701 at location (4, 4, Z) and (5, 4, Z) are marked with dark color. The location is represented by the X, Y, Z coordinates of a voxel. FIG. 15 shows the original image as a grayscale image. The grayscale value of this image is from 0 to 255. Seed voxels are checked (Step 641) to see whether they are available and whether they are within the bound of the image set. If seed voxels are available, continue to Step "b" to start the image segmentation process (Step 644) through region growing. If seed voxels are not available, Step 642 is carried out to generate seed voxels automatically. For example, a predefined value range may be used to select seed voxels within a value range.

b) The image segmentation process through region growing starts at the seed voxel locations. The process grows each region by merging neighboring voxels that are within a certain similarity criterion and repeats the process until no more neighboring voxels are available for merging. In this example, we choose a simple criterion for measuring voxel similarity, that is, for a neighboring voxel to qualify as similar to a reference voxel, the grayscale value difference between the neighboring voxel and the reference voxel must be less than 20. In other words, if the grayscale value difference is less than 20, the neighboring voxel is added to the region and the region grows by one voxel. If the grayscale value difference is equal to or greater than 20, the voxel is not added to the region. For example, voxel 702 (4, 3, Z) in FIG. 15 has a grayscale value of 103. The difference between this value and the grayscale value (102) of the voxel located at (4, 4, Z) 701 is 1. The difference is within the similarity criterion, so the neighboring voxel 702 is added to the region. FIG. 16 illustrates the first round of region growing for the image example shown in FIG. 15. All neighboring voxels with grayscale difference less than 20 are marked with a dark color. 8 voxels 702 (marked with horizontal hatch lines) at locations (4, 3, Z), (5, 3, Z), (3, 4, Z), (6, 4, Z), (3, 5, Z), (4, 5, Z), (5, 5, Z), (6, 5, Z) are added to the region. Here the image plane is assumed to be parallel to the XY plane therefore all voxels have the same Z value.

FIG. 17 illustrates the result of the second round region growing. 3 voxels 703 (marked with vertical hatch lines) at locations (4, 6, Z), (5, 6, Z), (6, 6, Z) are added to the region.

FIG. 18 illustrates the result of the last round region growing. 1 voxel 704 (marked with diagonal hatch lines) at locations (5, 7, Z) is added to the region. After this round, no more voxels meet the similarity criteria. The region growing process stops. All voxels added to the region are marked with value 1 and the rest of the voxels are marked with value 0 as shown in FIG. 19.

In FIG. 14, after the image region of the selected organ has been idenfitied (Step 644), a geometric representation is generated in the format of either 3D points, or contours, or surfaces (Step 645, 646, or 647). The geometric representation is then sent to a 3D printer to create a physical model 649 (Step 648).

The above example describes one embodiment of the single-action 3D image printing methods in which the image segmentation technique uses a region growing method. Other image segmentation methods may be used to generate similar results.

(5) User Adjustable Physical Model Printing Method

This embodiment is implemented as a printing template for printing a physical model from an image data set using user adjustable image processing parameters and steps.

FIG. 20 illustrates an exemplary printing template that adopts a user adjustable physical model printing method. This printing template provides a user with a list of selectable processing options and adjustable parameters for image segmentation and data conversion. The user 11 makes the initial selection of parameters and segmentation methods (Step 651). The segmentation methods may include the ones described in the above examples, such as region growing, image thresholding, graph partitioning, and others. The parameters may include value ranges that are adjustable, user defined seed regions, and others. The image segmentation process (Step 654) segments the input image using the selected methods and parameters. The geometric representation generated from the image segmentation process is used to create a 3D rendering (Step 660) to show how a final physical model may look on a computer. The computer 15 (FIG. 2) can be used to display a three-dimensional rendering 660 of the model generated by the image segmentation process. The three-dimensional rendering may be implemented using volume rendering of the segmented image or surface rendering from the surface model 657. If the rendering meets the user's requirements, the segmented image is converted to a format supported by the 3D printer 658 for printing (Steps 655, 656, or 657). Otherwise, the user can make additional adjustments. The user can decide to print the 3D model on a 3D printer using the current settings or continue the adjustment (Step 651) until the user is satisfied with the settings for printing.

Similar to other embodiments as described above, this embodiment further includes the processing steps of converting an image data set 650 to a geometric representation in a data format supported by the 3D printer and sending the geometric representation to the 3D printer to generate a physical model of selected organs or parts 659 (Step 658).

(6) Extension to n-Dimension

Although the present method has been described with reference to 3D image data sets, it will be immediately apparent to persons of skill in the art that the methods described above are readily applicable to any number of dimensions. It is contemplated that the methods may be applied to n-dimensional data, where n may be 2, 3, 4 or any number larger than 4. In particular, it is contemplated that the invention may be applied to n-dimensional data in which one of the dimensions is time and there are two or three spatial dimensions. For example, we can use the above described methods to produce multi-dimensional physical models that evolve over time.

It should be appreciated that the present method greatly reduces the time required for printing physical models from an n-dimensional data set, including a 3D data set. Therefore practical applications capable of producing a series of physical models from time-sequence image data sets to show changes of shape or motions can be implemented. For example, time-sequence 3D image data of a chest containing a beating heart may be used to generate a series of chest models to show the shape and motion of the beating heart at different time points.

Although the present invention has been described in terms of various embodiments, the invention is not limited to these embodiments. Modification within the spirit of the invention will be apparent to those skilled in the art. For example, various different single-actions can be used to effect the printing of a physical model from an image data set. For example, a voice command may be spoken by the user. A key may be depressed by the user. A button on a 3D printing device may be pressed by the user. Selection using any pointing device may be effected by a user to start the execution of a printing template. Although a single-action may be preceded by multiple physical movements of the user (e.g., moving a mouse so that a mouse pointer is over a button), the single-action generally refers to a single event received by a system that commands the system to print a physical model from an image data set or a derived representation of the image. Finally, various of techniques for identifying voxel categories and generating a geometric representation can be used to print a physical model from an image data set.

What is claimed is:

1. A system for printing a 3D physical model from an image data set, comprising:
   a display component for displaying one or more printing templates; and
   a single-action data processing component that, in response to a printing template selected by a single action by a user, executes the selected printing template to take the image data set as input and generates a geometric representation for use as input to a 3D printer;
   wherein the selected printing template comprises predefined instructions for processing the image data set.

2. The system of claim 1, wherein the one or more printing templates are displayed by descriptive text, or by images including graphical icons or 3D renderings, or by a combination of text and images.

3. The system of claim 1, wherein the single-action is a clicking of a mouse button when a cursor is positioned over a predefined area of the displayed one or more printing templates, or a selection of an item from the displayed one or more printing templates.

4. The system of claim 1, wherein the single-action data processing component includes one or more printing templates, and wherein each printing template includes predefined instructions for identifying voxel categories, generating geometric representation and sending generated representation data to a 3D printer for printing a physical model.

5. The system of claim 1, wherein the image data set has a plurality of voxels, each voxel having an intensity value, and wherein the image data set comprises images of one or more three-dimensional regions obtained using one or more imaging modalities selected from magnetic resonance imaging, computed tomography, ultrasound, X-ray imaging, positron emission tomography, microscopy imaging, and simulated image data.

6. The system of claim 1, wherein the printing template is a software program configured to perform the following steps when executed:
- identifying voxel categories in the image data set using predefined criteria;
- generating a geometric representation from the identified voxel categories; and
- sending the generated representation data to a 3D printer for printing a physical model.

7. The system of claim 6, wherein the geometric representation is a list of 3D points, a list of 3D contours, a list of 3D polygonal surface models, or a combination of them.

8. The system of claim 1, wherein the 3D printer is a rapid prototyping device for producing physical models directly from digital geometric representations.

9. The system of claim 1, wherein a physical model is generated using a 3D printing process on the 3D printer.

* * * * *